(12) United States Patent
Kishikawa

(10) Patent No.: US 7,343,268 B2
(45) Date of Patent: Mar. 11, 2008

(54) THREE-DIMENSIONAL ELECTRONIC MAP DATA CREATION METHOD

(75) Inventor: Kiyonari Kishikawa, Kasuga (JP)

(73) Assignee: Zenrin Co., Ltd., Fukuoka (JP)

( * ) Notice: Subject to any disclaimer, the term of this patent is extended or adjusted under 35 U.S.C. 154(b) by 555 days.

(21) Appl. No.: 10/481,393

(22) PCT Filed: Jun. 19, 2002

(86) PCT No.: PCT/JP02/06132

§ 371 (c)(1), (2), (4) Date: Dec. 19, 2003

(87) PCT Pub. No.: WO03/001460

PCT Pub. Date: Jan. 3, 2003

(65) Prior Publication Data

US 2005/0177350 A1 Aug. 11, 2005

(30) Foreign Application Priority Data

Jun. 20, 2001 (JP) .............................. 2001-185968

(51) Int. Cl.
*G06F 17/50* (2006.01)
*G06T 17/00* (2006.01)
*G06T 15/00* (2006.01)

(52) U.S. Cl. .......................... 703/1; 345/419; 345/420

(58) Field of Classification Search .................... 703/1; 382/100, 276, 154; 345/418, 419, 420; 321/106, 419

See application file for complete search history.

(56) References Cited

U.S. PATENT DOCUMENTS 6,222,583 B1 * 4/2001 Matsumura et al. ........ 348/113
6,363,169 B1 * 3/2002 Ritter et al. ................ 382/154
6,628,279 B1 * 9/2003 Schell et al. ................ 345/420

FOREIGN PATENT DOCUMENTS

| CN | 1203369 A | 12/1998 |
|---|---|---|
| JP | 06-348815 | 12/1994 |
| JP | 09-097354 | 4/1997 |

(Continued)

OTHER PUBLICATIONS

Liu et al., "Recognizing Buildings in Urban Scene of Distant View", Jul. 1998, CSIS Discussion Paper #2.*

(Continued)

*Primary Examiner*—Paul Rodriguez
*Assistant Examiner*—Nithya Janakiraman
(74) *Attorney, Agent, or Firm*—Beyer Weaver LLP

(57) ABSTRACT

When creating three-dimensional electronic map data, three-dimensional modeling of a building is performed as follows without measuring height of the building. Firstly, a building is photographed and the photographing position and photographing parameters (camera direction, angle of view) are recorded. Secondly, in a virtual space prepared on a computer, a photograph is arranged so as to reproduce the state upon the photographing according to these data. In combination with this, a plan view of the building is arranged according to the two-dimensional map data. Thirdly, the plan view is moved in the height direction until it is overlapped with the photograph, thereby modeling the building. Thus, it is possible to realize three-dimensional modeling without measuring the height.

18 Claims, 19 Drawing Sheets

FOREIGN PATENT DOCUMENTS

| | | |
|---|---|---|
| JP | 11-232484 | 8/1999 |
| WO | WO01/37216 A2 | 5/2001 |

OTHER PUBLICATIONS

O'Keefe et al., "The World Trade Center and the distance to the world's center," Feb. 1992, American Journal of Physics USA, vol. 60, No. 2.

Jussi Lammi, "Spatially Constrained Building Extraction Using Edge Finding and Model Fitting," Sep. 1997, IAPRS, vol. 32, Part 3-4W2.

Thomas A. Funkhouser, "A visibility algorithm for hybrid geometry—and image-based modeling and rendering," Oct. 1999, Computers and Graphics, vol. 23.

Liu et al., "Recognizing Buildings in Urban Scene of Distant View," Jul. 1998, CSIS Discussion Paper #2.

Supplementary European Search Report dated Jul. 25, 2005 from corresponding European Application No. 02741202.2-2218.

Chinese Office Action dated Dec. 30, 2005 from corresponding Chinese Application No. 028121473.

* cited by examiner ical field

THREE-DIMENSIONAL ELECTRONIC MAP DATA CREATION METHOD

TECHNICAL FIELD

The present invention relates to a three-dimensional modeling method of generating three-dimensional electronic data of a building structure, as well as to a technique of generating three-dimensional electronic map data by taking advantage of the three-dimensional modeling method.

BACKGROUND ART

Use of map data converted in a computer processible form (hereafter referred to as 'electronic map data') has recently been spread to various fields. The electronic map data are used for display of maps on personal computers, navigation systems mounted on vehicles, display of maps via the Internet, and production of mechanicals for maps in print. Three-dimensional display is adopted in the navigation system to help the driver's intuitive understanding of the drive course. Three-dimensional display of building structures advantageously assists the user's easy specification of the current position and the drive course.

Three-dimensional data of the building structures are required for the three-dimensional display. Extensive labor is, however, required to obtain three-dimensional data, especially height-relating data, with regard to a large number of building structures as objects of display in the maps. Diverse techniques have been proposed to relive such enormous labor. Examples of the proposed techniques include a technique disclosed in Japanese Patent No. 3015353 and 'Simulation in Automatic Measuring of Three-Dimensional Urban Space Data in Range Images', Ghao Huijing et al. (Institute of Industrial Science, University of Tokyo), Vol. 36, No. 4, 1997, 'Photogrammetry and Remote Sensing', Japan Society of Photogrammetry and Remote Sensing. The former technique aims to relieve the load of data acquisition by ingeniously setting a measurement point of the height of a building structure and the direction of measurement. The latter technique acquires three-dimensional data by matching the results of ranging with a laser range finder with CCD images.

In order to attain three-dimensional modeling of a building structure with lack of three-dimensional data, the conventional method assumes a fixed height regardless of the actual height of the building structure, or estimates the height of the building structure by the number of stories. These methods, however, do not sufficiently reflect the actual state and only give pseudo three-dimensional modeling.

The conventional three-dimensional modeling method requires measurement of each building structure to effectuate modeling that sufficiently reflects the actual state. Three-dimensional modeling of a huge number of building structures is required to generate practical three-dimensional electronic map data. The above proposed techniques thus do not sufficiently relive the labor but still demand an extremely large amount of labor for generation of the three-dimensional electronic map data.

In the span of several years, some new building structures are constructed and some old building structures are demolished. In order to ensure the practical use of the three-dimensional electronic map data, three-dimensional modeling should be performed at intervals following such a change of the building structures. The conventional techniques, however, require a long time for three-dimensional modeling and thus do not meet this time-based demand.

DISCLOSURE OF THE INVENTION

The object of the present invention is thus to solve the problems of the prior art techniques and to provide a method of labor-saving yet practical three-dimensional modeling that reflects the actual state of a building structure. The object of the invention is also to provide a technique of readily generating three-dimensional electronic map data by taking advantage of the three-dimensional modeling method.

In order to attain at least part of the above and the other related objects, the present invention is directed to a three-dimensional modeling technique without requiring measurement of a height. This technique carries out matching of a photograph of a building structure with its planar shape in a virtually provided space, for example, with the aid of a computer. The description first regards the principle of three-dimensional modeling in the present invention, prior to discussion of the construction of the invention.

FIG. 1 shows the principle of three-dimensional modeling in the present invention. The illustration gives a virtual space provided on a display DISP of a computer. The virtual space is defined in a three-dimensional coordinate system of, for example, latitude, longitude, and altitude. At the initial stage, only a ground surface GRD in the virtual space appears on the display DISP.

The procedure locates a photograph PIC of a building structure as an object of three-dimensional modeling (hereafter simply referred to as the object) and a planar shape PV of the object in the virtual space. The photograph PIC is located, based on various pieces of information including a shooting position, an orientation of a camera, and an angle of view at the time of photographing. The photograph PIC thus located represents an image PB, which is to be displayed if the object is present in the virtual space. The planar shape PV of the object is readily obtained by existing two-dimensional map data.

The procedure then shifts the planar shape PV in parallel in the direction of height as shown by the lower drawing. This creates a virtual three-dimensional model of the planar shape PV in the virtual space. As mentioned above, the photograph PIC gives the image PB to be displayed if the object is present in the virtual space. Overlap of the three-dimensional model obtained by the parallel shift of the planar shape in the direction of height with the image PB means that the three-dimensional model reflects the actual height of the object. The procedure shifts the planar shape in the direction of height to reproduce the actual scene taken by photographing, thus attaining the three-dimensional modeling of the object.

The principle of the invention is discussed with reference to the display of the computer shown in FIG. 1. The discussion further regards the principle of the invention according to the shooting conditions. FIG. 2 shows the relation between a photographed image and a building structure. The upper drawing and the center drawing respectively show a plan view V1 and a side view V2 at the time of photographing. The lower drawing shows a photograph PIC obtained.

As shown in the plan view V1, two building structures BLDa and BLDb are present in the range of an angle of view θ of a camera DSC. These two building structures BLDa and BLDb have similar heights in the photograph PIC, but actually have different heights Ha and Hb as shown in the side view V2. The range of the building structures is expressed by a thick line in the photograph PIC included in the side view V2. The top of the thick line is naturally located on a line segment of connecting the camera DSC with the tops of the building structures.

The procedure of the invention reproduces the positional relation shown in FIG. 2 in the virtual space, thus effectuating three-dimensional modeling. The heights of the building structures BLDa and BLDb are unknown in the initial stage of modeling in the virtual space. Location of the camera DSC and the photograph PIC corresponding to the positional relation at the time of shooting causes the tops of the building structures BLDa and BLDb to be present on an extension of the building structures (expressed by the thick line) in the photograph PIC. Overlap of the top of the model obtained by parallel shift of the planar shape in the direction of height in the virtual space with the top of the photograph well reproduces the positional relation of FIG. 2 in the virtual space. This arrangement specifies the heights of the respective building structures BLDa and BLDb in the virtual space without measuring the actual heights thereof.

The above description shows the principle of three-dimensional modeling of the invention. The discussion is based on the concrete example shown in FIGS. 1 and 2, for the better understanding of the principle. The present invention is thus not restricted to such description in any sense. The construction of the invention based on the principle is discussed below.

The three-dimensional modeling method of the invention has the steps discussed below. The step (a) inputs a photograph of the building structure expressed by electronic data. The input of the photograph may be attained by inputting electronic data of a digital still camera or by inputting electronic data of a conventional photograph with a scanner or the like. The photograph may not show the whole building structure but is required to include at least an upper portion of the building structure.

The step (b) inputs a positional relation between a shooting position of the photograph and the building structure and a shooting parameter required to fit the photograph to an actual scene of viewing the building structure from the shooting position. The positional relation and the shooting parameter are utilized as data for reproducing the shooting conditions in the virtual space. The shooting position is not required to be defined by absolute coordinates of, for example, latitude and longitude, but is sufficient to be defined by the relative position to the building structure. The absolute coordinates of, for example, latitude and longitude may be used to specify the shooting position and the position of the building structure, according to the requirements.

The shooting parameter may be any of various parameters that specify the orientation of the camera and the angle of view at the time of shooting. FIG. 3 shows the angle of view of the camera. A focal length f denotes a distance between a lens L and a shooting unit CCD. The focal length specifies the angle of view, that is, the width of a range OBJ possibly taken by the shooting unit CCD. The angle of view θ and the focal length f may thus be used for the shooting parameter.

FIG. 4 shows the shooting direction of the camera. Axes X, Y, and Z in the illustration correspond to the axes in a virtual space. The latitude and the longitude may microscopically be regarded as orthogonal coordinates, so that the axes X and Y may be mapped to the latitude and the longitude. In the virtual space of the defined three axes, the shooting direction of the camera is specified by a yaw angle α, a pitch angle β, and a roll angle γ. Namely these angles may be used as parameters for specifying the shooting direction. The shooting direction may be specified by a diversity of other parameters, but the set of three angles shown in FIG. 4 advantageously facilitates acquisition of the parameters at the time of photographing.

After input of the shooting parameter, the step (c) defines a planar shape of the building structure and the shooting position in a virtual space set for generation of the three-dimensional electronic data, based on the input positional relation, and arranges the photograph at a position specified by the input shooting parameter. It is not necessary that the planar shape of the building structure is perfectly specified as a closed figure as in the example of FIGS. 1 and 2. The only requirement is to specify a planar shape corresponding to the face included in the photograph. The planar shape may thus be a line segment or polygonal line.

The step (d) maps the defined planar shape in a direction of height to be matched with the photograph, so as to specify a shape of the building structure in the direction of height. The mapping may be performed manually by an operator or may be carried out automatically.

The three-dimensional modeling method of the invention efficiently creates a three-dimensional model without measuring the height of each building structure. Compared with the conventional pseudo estimation of the height of a building structure by the number of stories, this method attains three-dimensional modeling with a remarkably higher accuracy.

When one photograph includes multiple building structures, the three-dimensional modeling method of the invention advantageously implements simultaneous three-dimensional modeling of the multiple building structures, based on this photograph. The photograph used may not be taken on the ground. Application of an aerial photograph facilitates three-dimensional modeling in a wide range.

As mentioned above, it is not necessary to completely specify the planar shape used in the three-dimensional modeling method of the invention. One preferable procedure, however, specifies the planar shape by a two-dimensional plane map including the building structure. The planar shape of the high accuracy results in three-dimensional modeling of the high accuracy.

In one preferable embodiment of the three-dimensional modeling method of the invention, the step (c) defines a three-dimensional base model giving a rough contour of the building structure, as well as the planar shape. The building structures include houses of relatively complicated shapes, as well as office buildings of relatively simple shapes. The three-dimensional base models are used to classify building structures according to their shapes, for example, into office buildings and houses and to define the rough contours of the respective classified building structures. Application of the base model in addition to the planar shape defines the rough shape of the building structure including the direction of height. This ensures labor-saving yet accurate three-dimensional modeling.

The step (d) in the method of the invention may manually be carried out by an operator or may automatically be performed by, for example, a computer. In the latter case, the step (d) includes the sub-steps of: analyzing the photograph to specify an edge of the building structure; quantitatively analyzing an overlap status of a side of the planar shape with the specified edge in the course of mapping; and selecting a mapping of a local maximum overlap to specify a height of the building structure. The 'local maximum' overlap may not be the greatest overlap. In the course of auto analysis, the overlap state significantly varies by the effects of noise. The concrete procedure thus filters out such noise and specifies the map of a substantially maximum overlap.

In one preferable application of the invention, the three-dimensional modeling method reflects the altitude of ground surface in the vicinity of the building structure. Such reflection is allowed by the process of inputting altitude data representing an altitude of ground surface in the vicinity of the building structure, making the input altitude data reflect on the ground surface in the vicinity of the building structure, and specifying the shape of the building structure by taking into account the altitude data. The method of specifying the shape based on the altitude data may specify the shape of the building structure in the direction of height, above the ground surface on which the altitude data is reflected. This arrangement ensures accurate specification of the height of the building structure.

The three-dimensional modeling method of the invention may further include a step (e) of attaching at least part of the photograph as a texture to surface of a resulting model of the building structure having the specified shape in the direction of height. The photograph used for attachment as the texture may be separately provided from the photograph used for specification of the height. Application of the photograph on the surface of the model relatively easily enhances the touch of reality in modeling.

In the case of applying the photograph to the texture, one preferable procedure separately deals with a repetition area, in which a relatively similar unit structure appears repeatedly, from a residual single area. For example, the step (e) may define the repetition area and the single area and repeatedly attaches a texture of the unit structure to the repetition area, whether an actual structure is included or not included in the photograph. This facilitates attachment of the texture in the repetition area and enhances the practical use of the texture. In the actual state, trees and other obstacles located on the front side of a building structure often interferes with taking a photograph of the face of the building structure. The repeated attachment technique applies a photograph representing part of the repetition area to the whole repetition area, and thus relatively easily relieves the effects of the obstacles.

The present invention is directed to a three-dimensional electronic map data generation method of generating three-dimensional electronic map data, which includes modeling of a building structure, as well as to the three-dimensional modeling method of the building structure alone.

Another application of the present invention is a three-dimensional modeling assist device that assists generation of three-dimensional electronic data of a building structure. In one preferable embodiment, the three-dimensional modeling assist device of the invention has an image data input mode, a shooting information input module, a virtual space display module, a projection module, and a model display module. The image data input module and the shooting information input module respectively input a photograph and a planar shape of the building structure, and a shooting parameter. The virtual space display module displays an image in a direction of viewing the building structure from the shooting position in a virtual space set for generation of the three-dimensional electronic data. The projection module projects the photograph in the virtual space, based on the shooting parameter. The model display module displays a shape of the building structure defined by mapping of the planar shape in a direction of height. The three-dimensional modeling assist device thus constructed efficiently assists the modeling of the invention.

Still another application of the invention is a three-dimensional modeling device that automatically generates three-dimensional electronic data of a building structure. In one preferable embodiment, the three-dimensional modeling device has a modeling module, in addition to the image data input module and the shooting information input module included in the three-dimensional modeling assist device discussed above. The modeling module defines the planar shape and the shooting position, arranges the photograph, and maps the defined planar shape in a direction of height to be matched with the photograph, so as to specify a shape of the building structure in the direction of height.

The present invention is also directed to a data collection device that collects data used to generate three-dimensional electronic data of a building structure. In one preferable embodiment, the data collection device has a shooting module, a shooting parameter acquisition module, and a data storage module. The shooting module obtains a photograph of the building structure in the form of electronic data. The shooting parameter acquisition module acquires a shooting parameter required to fit the photograph to an actual scene of viewing the building structure from a shooting position of the photograph. The data storage module stores the obtained electronic data and the acquired shooting parameter mapped to data regarding the shooting position. The data collection device of such construction ensures consolidated collection of required information.

The data collection device may be constructed in the form of a tripod for fixing a camera, but it is preferable that at least part of the data collection device is incorporated in a digital camera. In one especially preferable structure, the shooting parameter acquisition module is incorporated in a camera and acquires an orientation and a focal length of the camera at a time of photographing.

The technique of the invention is also actualized by computer programs that cause a computer to attain the three-dimensional modeling method, the three-dimensional electronic map data generation method, the three-dimensional modeling assist device, and the three-dimensional modeling device discussed above. Another application of the invention is recording media in which such computer programs are recorded. Typical examples of the recording media include flexible disks, CD-ROMs, magneto-optic discs, IC cards, ROM cartridges, punched cards, prints with barcodes or other codes printed thereon, internal storage devices (memories like RAMs and ROMs) and external storage devices of computers, and a variety of other computer readable media.

BEST MODES OF CARRYING OUT THE INVENTION

Figure 5:
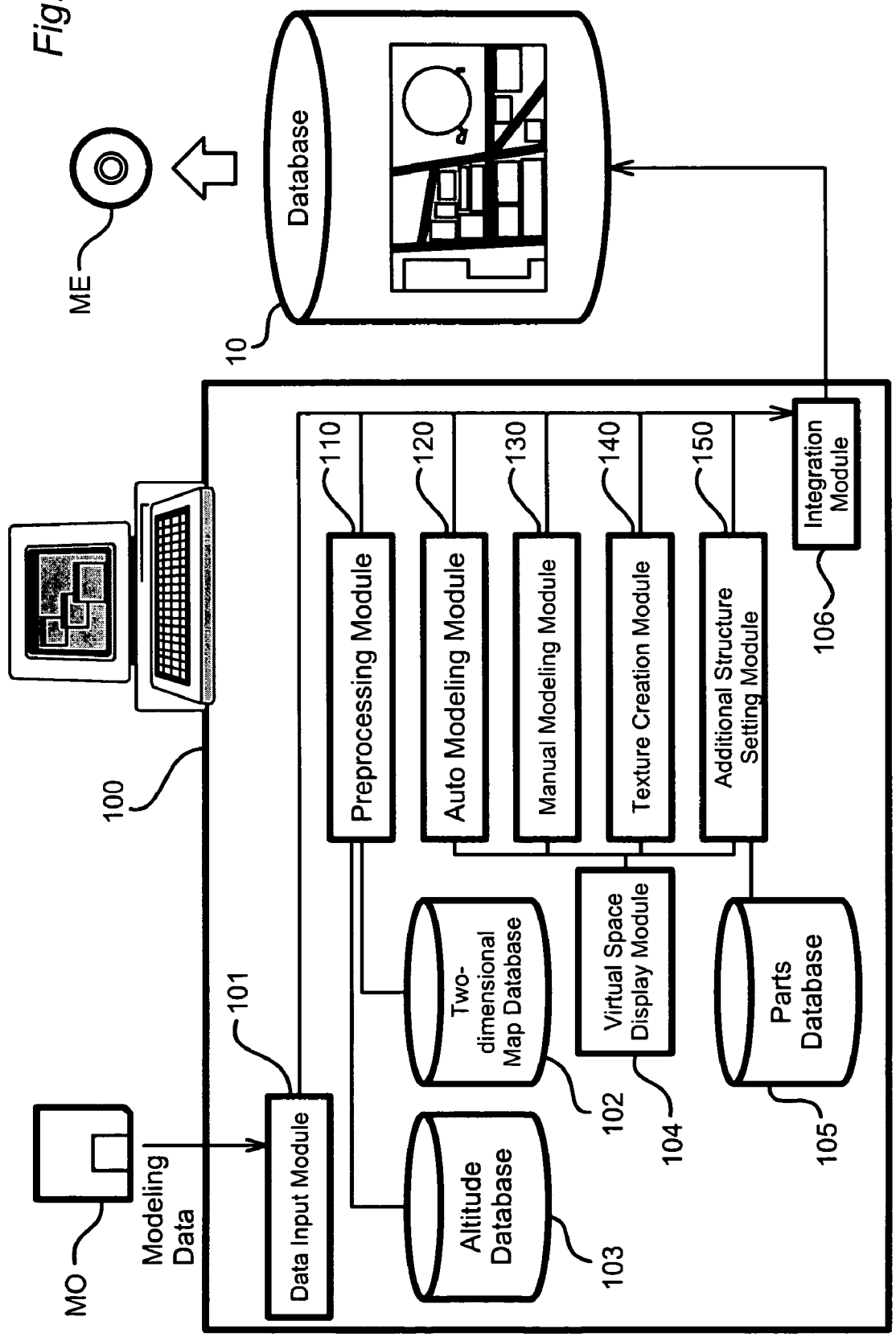
FIG. 5 illustrates the construction of an electronic map data generation system 100 in one embodiment.

One mode of carrying out the invention is described below in the following sequence:

A. Construction of Map Data Generation System
A1. Structure of Auto Modeling Module
A2. Structure of Manual Modeling Module
A3. Structure of Texture Creation Module
B. Modeling Data Collection Device
C. Modeling
C1. Preprocessing
C2. Auto Modeling Process
C3. Manual Modeling Process
C4. Texture Creation Process
C5. Additional Structure Setting Process A. Construction of Map Data Generation System FIG. 5 illustrates the construction of an electronic map data generation system 100 (hereafter may simply be referred to as the system 100) in one embodiment. The system 100 carries out three-dimensional modeling of a building structure to generate three-dimensional electronic map data. In this embodiment, the system 100 is actualized by the software configuration of the respective functional blocks in a computer. The system is made up of one single computer in this embodiment, although the system may be constructed by connection of a host computer with terminals via a network.

Figure 3:
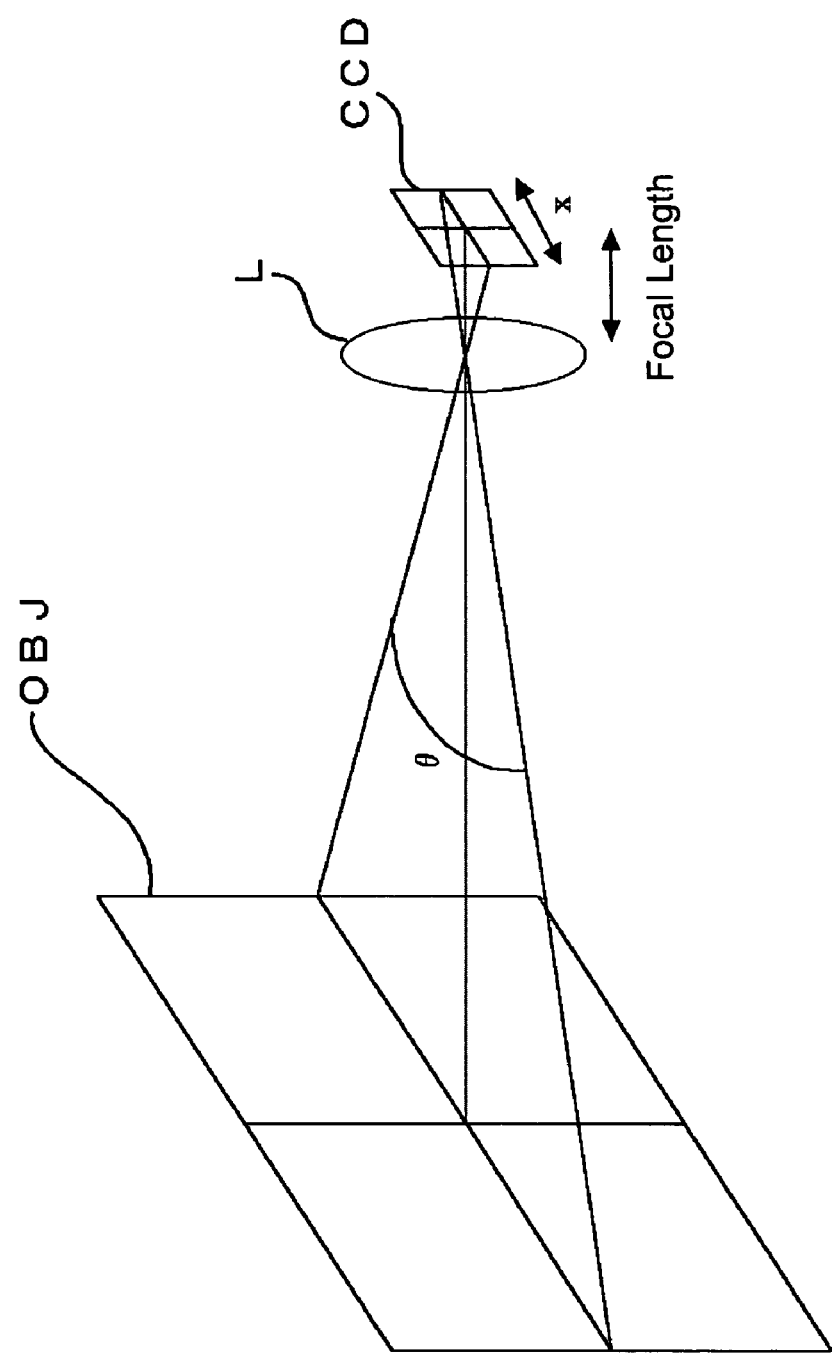
FIG. 3 shows the angle of view of a camera.
Figure 4:
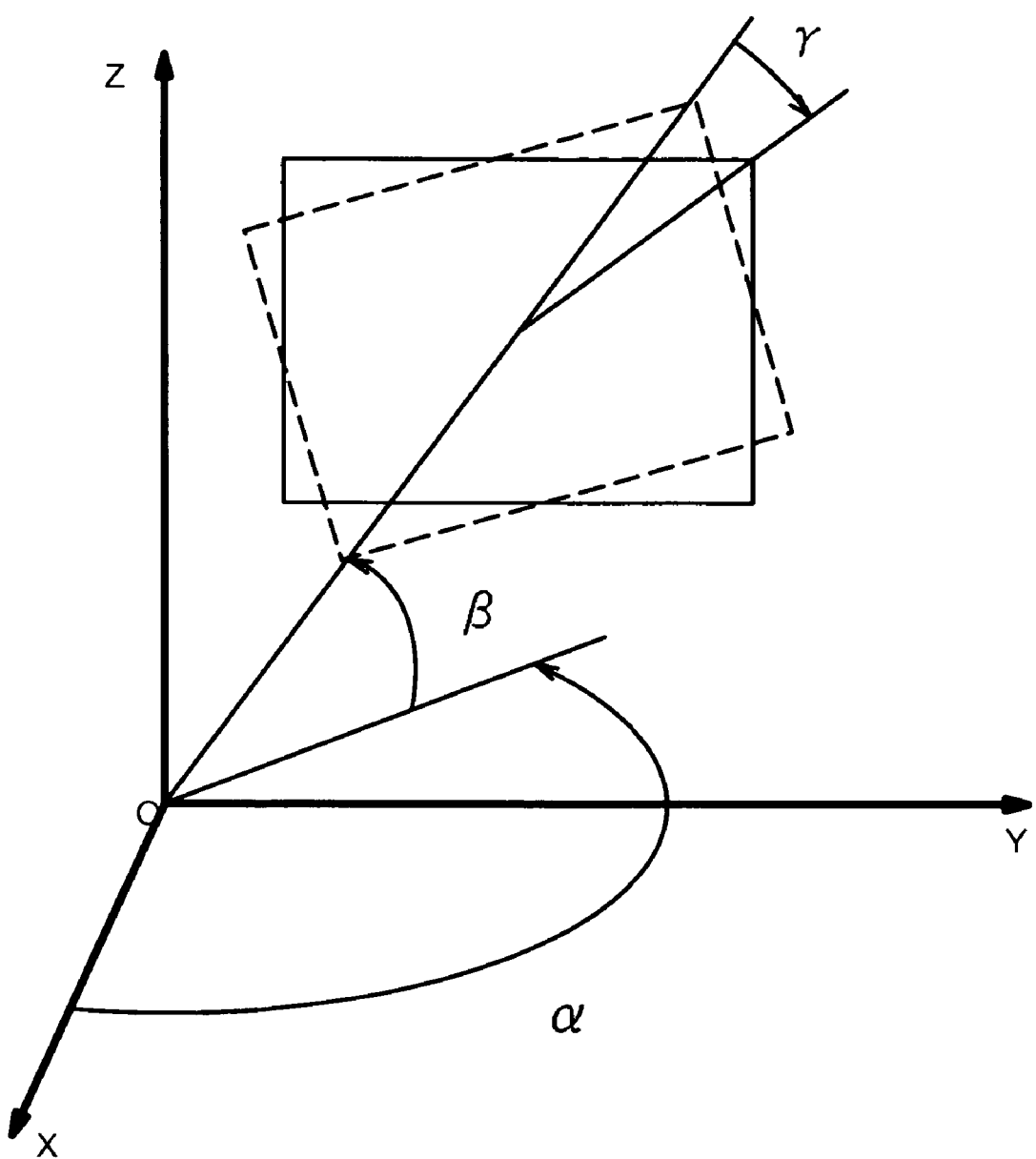
FIG. 4 shows the shooting direction of the camera.

The functional blocks of the system 100 respectively exert the functions discussed below. A data input module 101 externally inputs modeling data. Here the modeling data represents data required for three-dimensional modeling and includes electronic data of photographs of building structures as modeling objects, as well as their shooting positions and shooting parameters. In this embodiment, the shooting parameters include a yaw angle, a pitch angle, and a roll angle defining the orientation of a camera at the time of photographing (see FIG. 4) and a focal length representing an angle of view (see FIG. 3). These data may be input via a medium, such as a magneto-optic disc MO, or otherwise may be input via a network or another communication.

Multiple functional blocks discussed below take charge of execution of three-dimensional modeling, based in the input modeling data. A preprocessing module 110 functions to provide a virtual space used for three-dimensional modeling in the system 100. More concretely the preprocessing module 110 provides ground surface to build a three-dimensional model thereon. For this purpose, the preprocessing module 110 refers to an altitude database 103 and a two-dimensional map database 102. The altitude database 103 specifies an altitude of each grid square obtained by dividing the ground surface into grid squares. For example, 50 m-mesh data prepared by Geographical Survey Institute, Japan may be applicable to the altitude database 103. The two-dimensional map database 102 is an existing planar map database and is used to specify a planar shape of each building structure. Data like aerial photographs, satellite photographs, and house maps may be applicable to the two-dimensional map database 102.

An auto modeling module 120 functions to automatically generate a three-dimensional model, based on the modeling data. A virtual space display module 104 shows the progress of modeling in the virtual space on a display of the system 100. The principle of auto modeling has been discussed previously with reference to FIGS. 1 and 2. The auto modeling module 120 has multiple functional blocks to carry out auto modeling based on the principle, as discussed later.

A manual modeling module 130 functions to manually generate a three-dimensional model, in response to operations of an operator. In the structure of this embodiment, the object of manual modeling is building structures of complicated shapes that have difficulties in auto modeling. The virtual space display module 104 provides the display of a virtual space to be referred to by the operator for manual modeling. The manual modeling module 130 has multiple functional blocks to assist manual modeling, as discussed later.

A texture creation module 140 functions to attach a texture to each building structure generated by modeling, in response to operations of the operator. In the structure of this embodiment, the texture is a photograph of the building structure. The virtual space display module 104 provides the display to be referred to by the operator for attachment of the texture. The texture creation module 140 has multiple functional blocks to assist attachment of the texture, as discussed later.

An additional structure setting module 150 generates, by modeling, additional structures other than the building structures to be supplemented to the electronic map data. The additional structures include, for example, trees, traffic signals, and guardrails. The additional structures are defined by models registered in a parts database 105.

An integration module 106 functions to interrelate the data generated by the respective functional blocks discussed above and adjust the format of the electronic map data. The integration module 106 also specifies letters, characters, and numbers showing the building structure and the plane name, as well as various symbols and marks to be displayed on a resulting map. The integration module 106 outputs the resulting integrated electronic map data to a map database 10. The electronic map data may be recorded in a DVD-ROM or another recording medium ME.

A1. Structure of Auto Modeling Module

Figure 6:
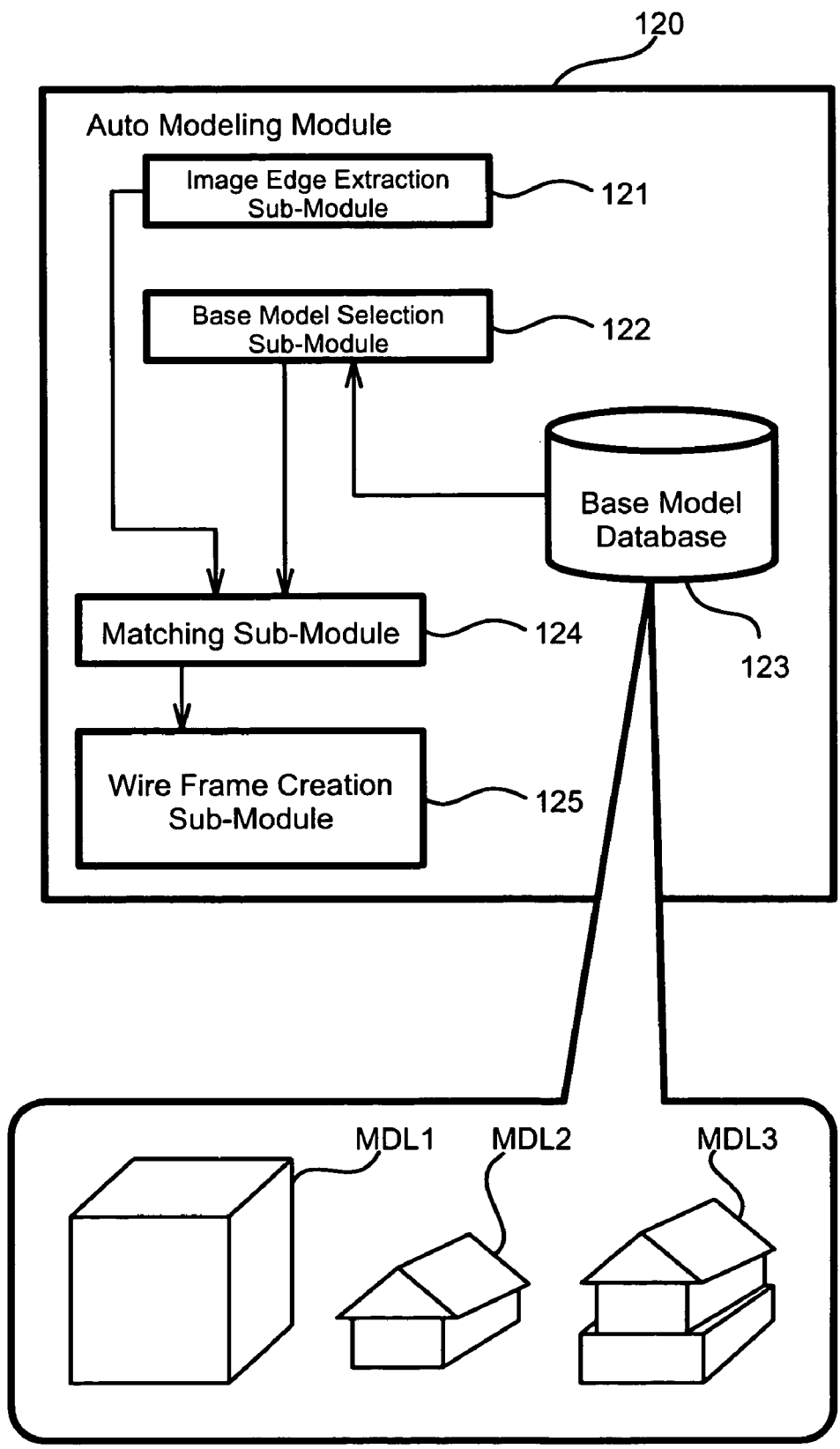
FIG. 6 illustrates the structure of an auto modeling module 120.

FIG. 6 illustrates the structure of the auto modeling module 120. The auto modeling module 120 uses the functional blocks discussed below to automatically generate a three-dimensional model of building structures, based on the principle of FIGS. 1 and 2 as described previously.

An image edge extraction sub-module 121 extracts the edges or edge lines of each building structure specified as the modeling object from the photograph of the building structure. The extraction of the edges is, for example, based on the tone differences among respective faces of the building structure.

A base model selection sub-module 122 selects a base model used for modeling out of a base model database 123. Examples of some base models are given in the illustration. The base models include, for example, a building model MD1, a one-story house model MD2, and a two-story house model MD3. Each base model gives the rough contour of a building structure. The procedure of the embodiment successively selects the base models in a preset order until an appropriate result is obtained in a subsequent matching process. The selection of the base model may be based on information given by the two-dimensional map database.

A matching sub-module 124 carries out a matching process, which alters the height of a selected base model to be fit to the photograph arranged in the virtual space. The overlap status of the extracted image edges with each selected base model determines the result of the matching. When alteration of the height of a current option of the base model still fails to match the base model with the extracted image edges, the matching sub-module 124 informs the base model selection sub-module 122 of the failed matching and makes a next option of the base model subjected to the matching process.

A wire frame creation sub-module 125 creates a wire frame of each building structure, based on the result of the matching.

A2. Structure of Manual Modeling Module

Figure 7:
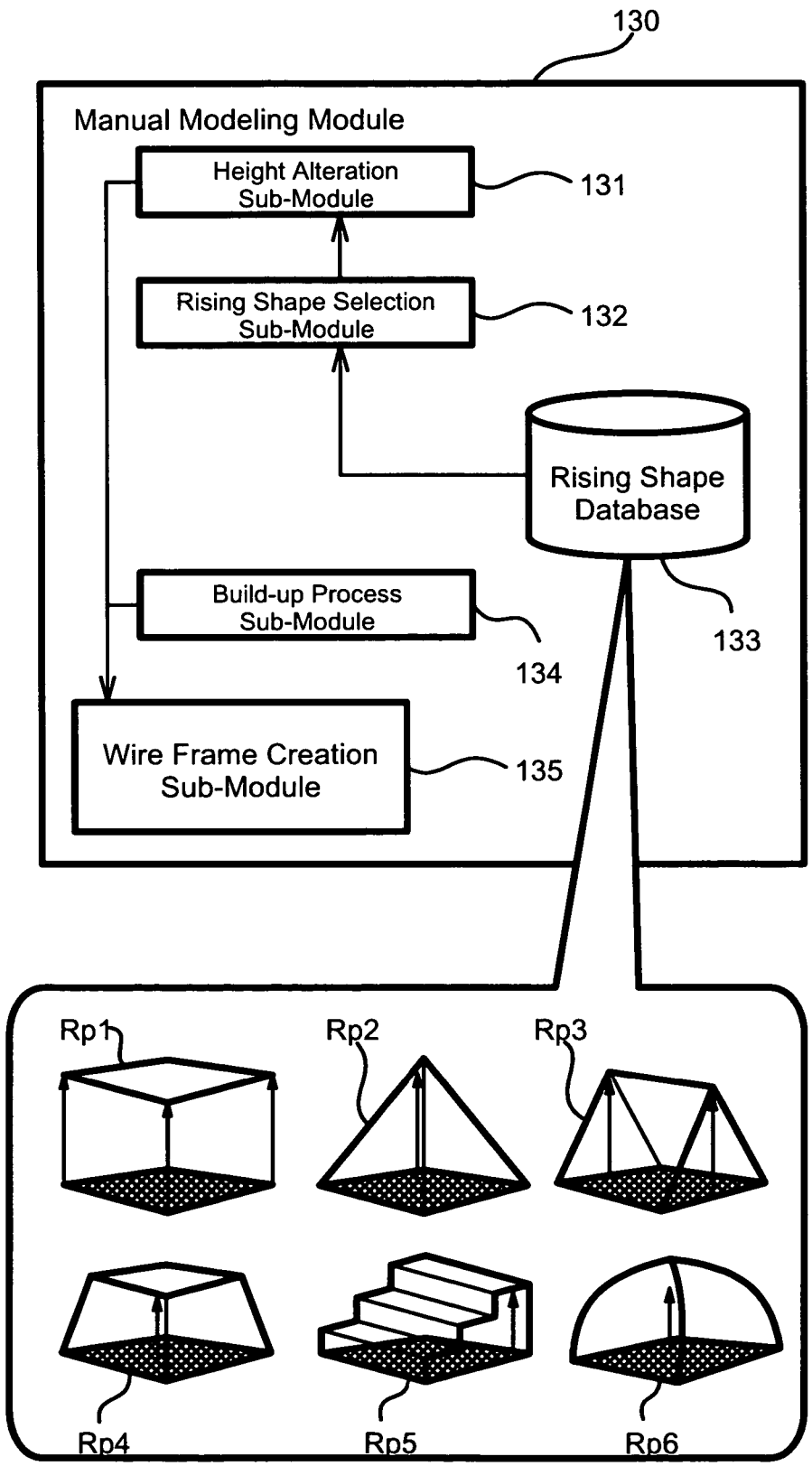
FIG. 7 illustrates the structure of a manual modeling module 130.

FIG. 7 illustrates the structure of the manual modeling module 130. The manual modeling module 130 uses the functional blocks discussed below to generate a three-dimensional model in response to the operations of the operator.

A rising shape selection sub-module 132 selects a rising shape, in response to the operator's instruction. Multiple rising shapes have been defined in advance in the form of a rising shape database 133. Examples of some rising shapes are given in the illustration. Each rising shape represents a model shape defined by shifting a planar shape in the direction of height in the virtual space. The rising shapes include, for example, a simple vertical rise Rp1, a point-concentrated rise Rp2, a line-concentrated rise Rp3, an expansion-contraction rise Rp4, a step rise Rp5, and a dome rise Rp6. Definition of various rising shapes aims to cover diverse shapes of building structures.

A height alteration sub-module 131 shifts a planar shape in the direction of height according to the selected rising shape. A build-up process sub-module 134 builds up multiple generated models to give an integrated model of more complicated shape. A wire frame creation sub-module 135 creates a wire frame of each building structure, based on the processing results of the height alteration sub-module 131 and the build-up process sub-module 134.

A3. Structure of Texture Creation Module

Figure 8:
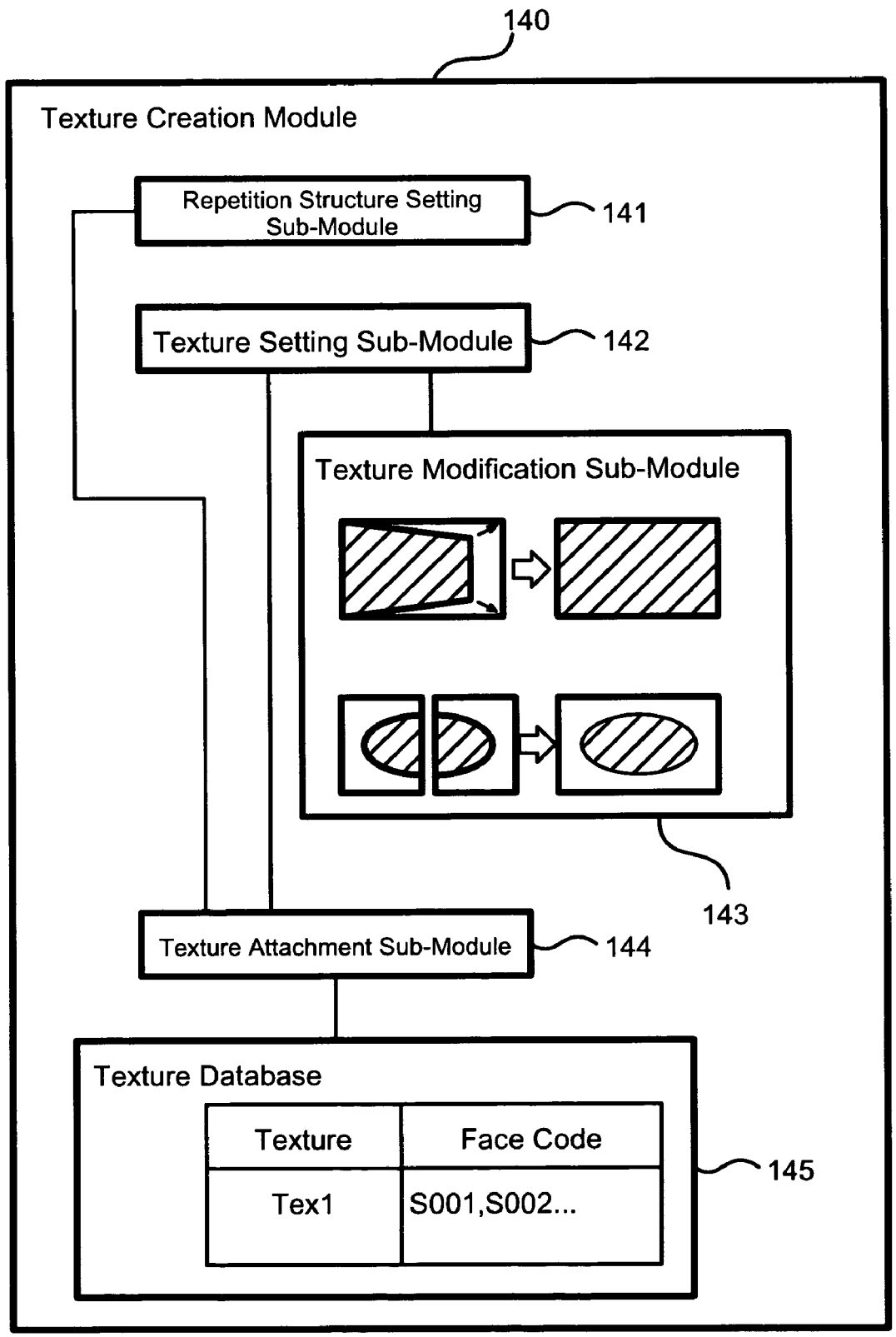
FIG. 8 illustrates the structure of a texture creation module 140.

FIG. 8 illustrates the structure of the texture creation module 140. The texture creation module 140 uses the functional blocks discussed below to attach a texture to each building structure generated by modeling.

A repeated structure setting sub-module 141 defines a repetition area, to which an identical texture is repeatedly applied, and a residual single area with regard to each building structure, in response to the operations of the operator. The repeated structure setting sub-module 141 also cuts the wire frame of the building structure according to the setting of the repetition area. A texture setting sub-module 142 sets a texture to be attached to each area. The procedure of this embodiment utilizes a cut of a photograph to set the texture. A texture modification sub-module 143 modifies the texture as the cut of the photograph to be fit to the surface of the model. An example of such modification is given in the illustration. A hatched area shows a texture as the cut of the photograph. The process of modification includes a change in shape of the texture, integration of or division into multiple textures, and color adjustment of the texture.

A texture attachment sub-module 144 attaches the texture set according to the definition of the repetition area. The preset texture is repeatedly applied to the repetition area, while being applied only once to the single area. The texture attachment sub-module 144 stores the results of the attachment in a texture database 145. The texture database 145 maps a code defining each texture to a code defining faces to which the texture is attached.

B. Modeling Data Collection Device

Figure 9:
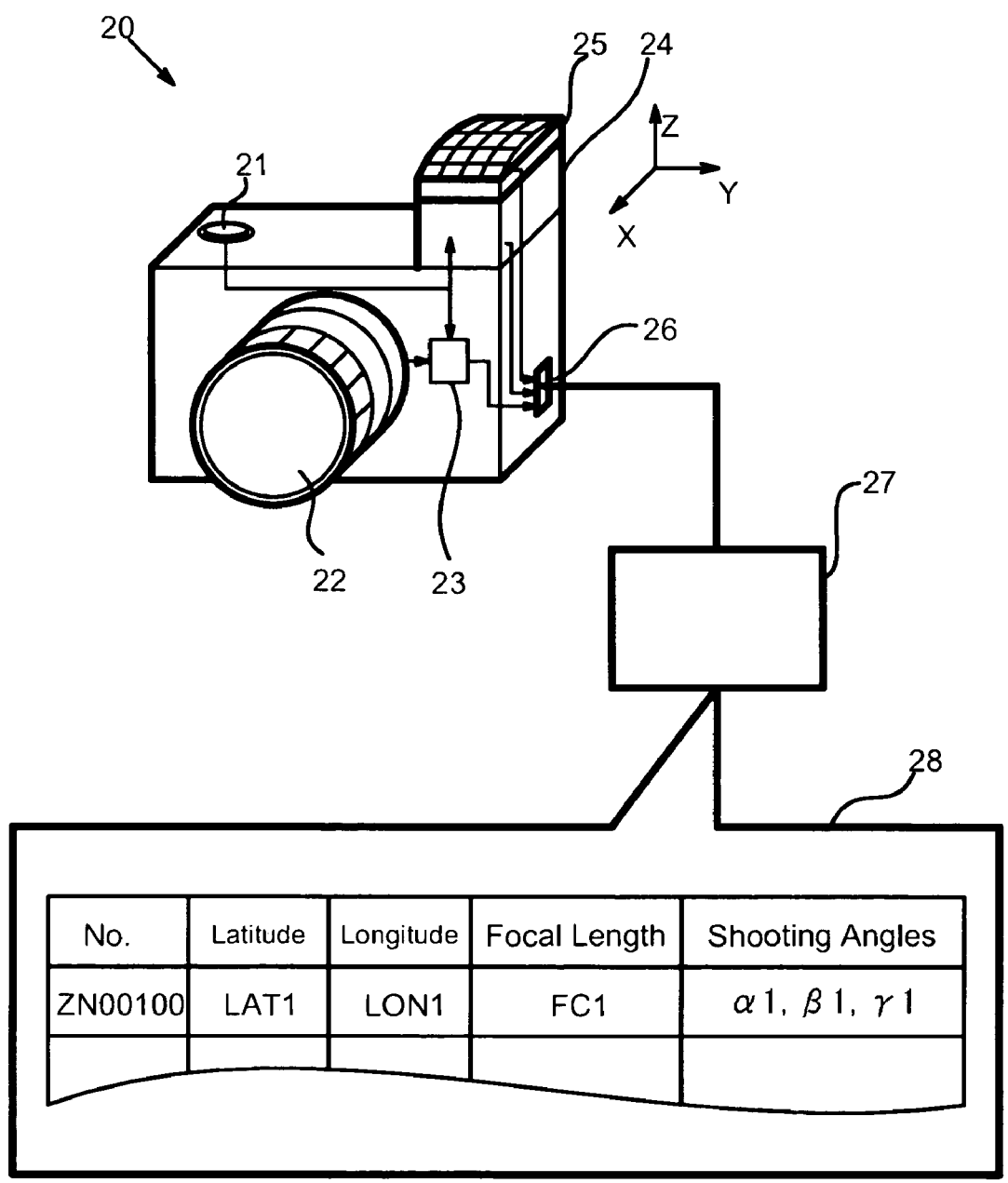
FIG. 9 illustrates the construction of a modeling data collection device.

FIG. 9 shows the construction of a modeling data collection device. The modeling data collection device includes a digital still camera (DSC) 20 and a data recorder 27. A typical example of the data recorder 27 is a mobile computer.

The DSC 20 functions to obtain shooting parameters synchronously with photography of a building structure. A GPS 25 is mounted on the main body of the DSC 20. The GPS 25 specifies the position by utilizing radio waves from satellites, as is well known. In the structure of this embodiment, the GPS 25 gains information on latitude, longitude, and altitude, synchronously with a motion of a shutter 21.

An angle sensor 24 is also mounted on the main body of the DSC 20. The angle sensor 24 gains the yaw angle, the pitch angle, and the roll angle, which define the orientation of the DSC 20 at the time of photographing, synchronously with the motion of the shutter 21. These angles are given as rotational angles about respective axes X, Y, and Z in an illustrated global coordinate system.

A lens 22 of the DSC 20 has a focal length sensor 23, which measures a focal length at the time of photographing synchronously with the motion of the shutter 21.

Data obtained by the respective sensors discussed above are transmitted to the data recorder 27 via an interface 26. The data recorder 27 stores the transmitted data in the form of a shooting database 28. An exemplified structure of the shooting database 28 is given in the illustration. In the illustrated example, values of a latitude 'LAT1', a longitude 'LON1', a focal length 'FC1', and shooting angles 'α1, β1, γ1' are stored corresponding to a code number 'ZN00100' allocated to each photograph. Photograph data and related comments may also be stored with these data.

In the structure of this embodiment, the respective sensors are incorporated in the DSC 20. The respective sensors may otherwise be provided separately from the DSC 20. In one example of the latter structure, the respective sensors may be incorporated in a tripod for fixing the DSC 20.

C. Three-Dimensional Modeling

Figure 10:
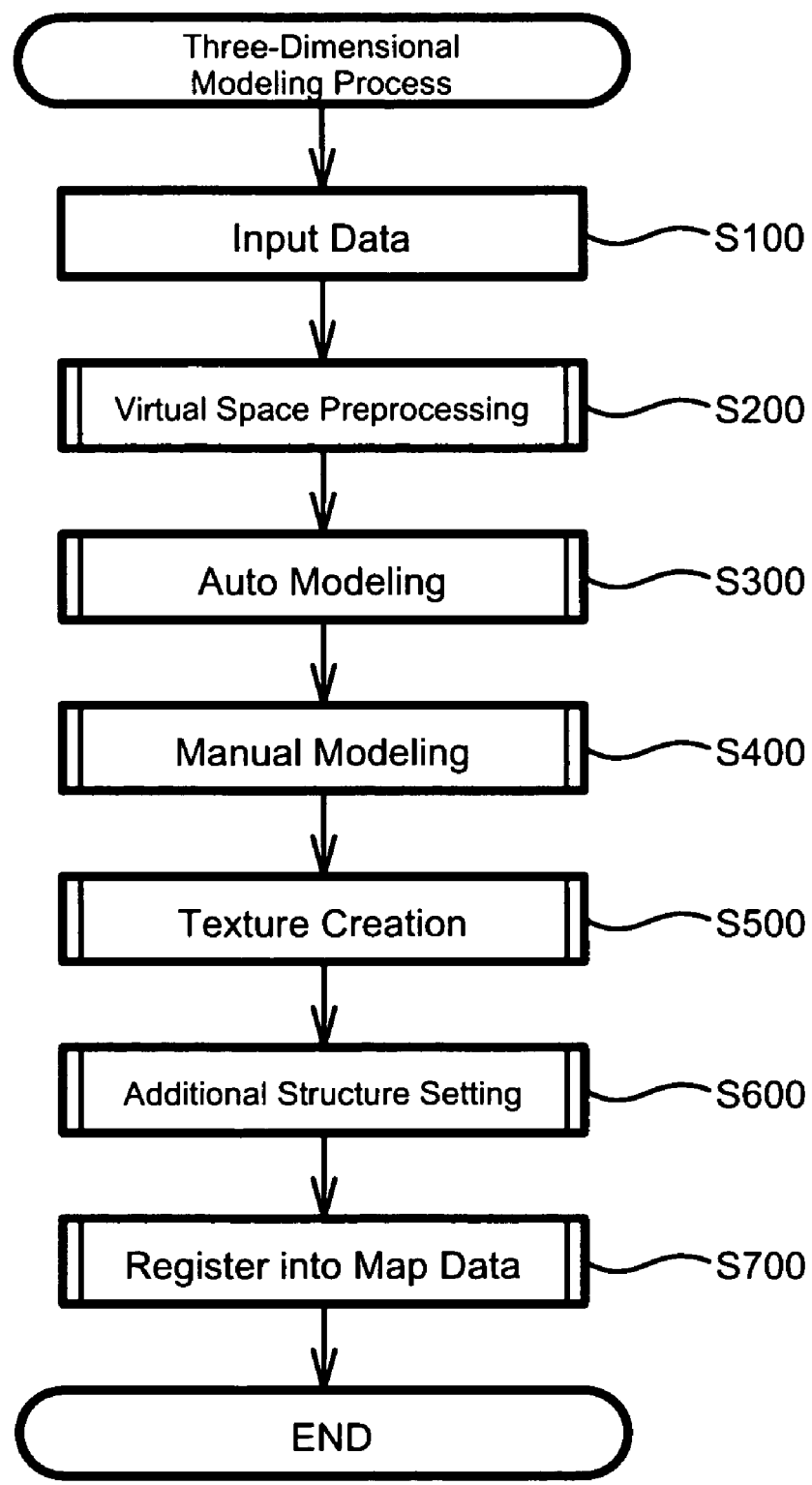
FIG. 10 is a flowchart showing a series of three-dimensional modeling.

FIG. 10 is a flowchart showing a series of three-dimensional modeling. This embodiment gives a flow of processing to model one building structure. The series of processing is executed automatically or in response to the operator's operations in the system 100 shown in FIG. 5.

When the three-dimensional modeling process starts, the operator first inputs modeling data into the system 100 (step S100). The modeling data includes the shooting parameters shown in FIG. 9 and a photograph.

The operator then carries out modeling of a building structure, based on the input modeling data. The modeling process includes a virtual space preprocessing step (step S200), an auto modeling step (step S300), a manual modeling step (step S400), a texture creation step (step S500), and an additional structure setting step (step S600). The system 100 registers a resulting generated model into map data (step S700) to complete three-dimensional modeling. The details of the processing at the respective steps are discussed below.

C1. Preprocessing

Figure 11:
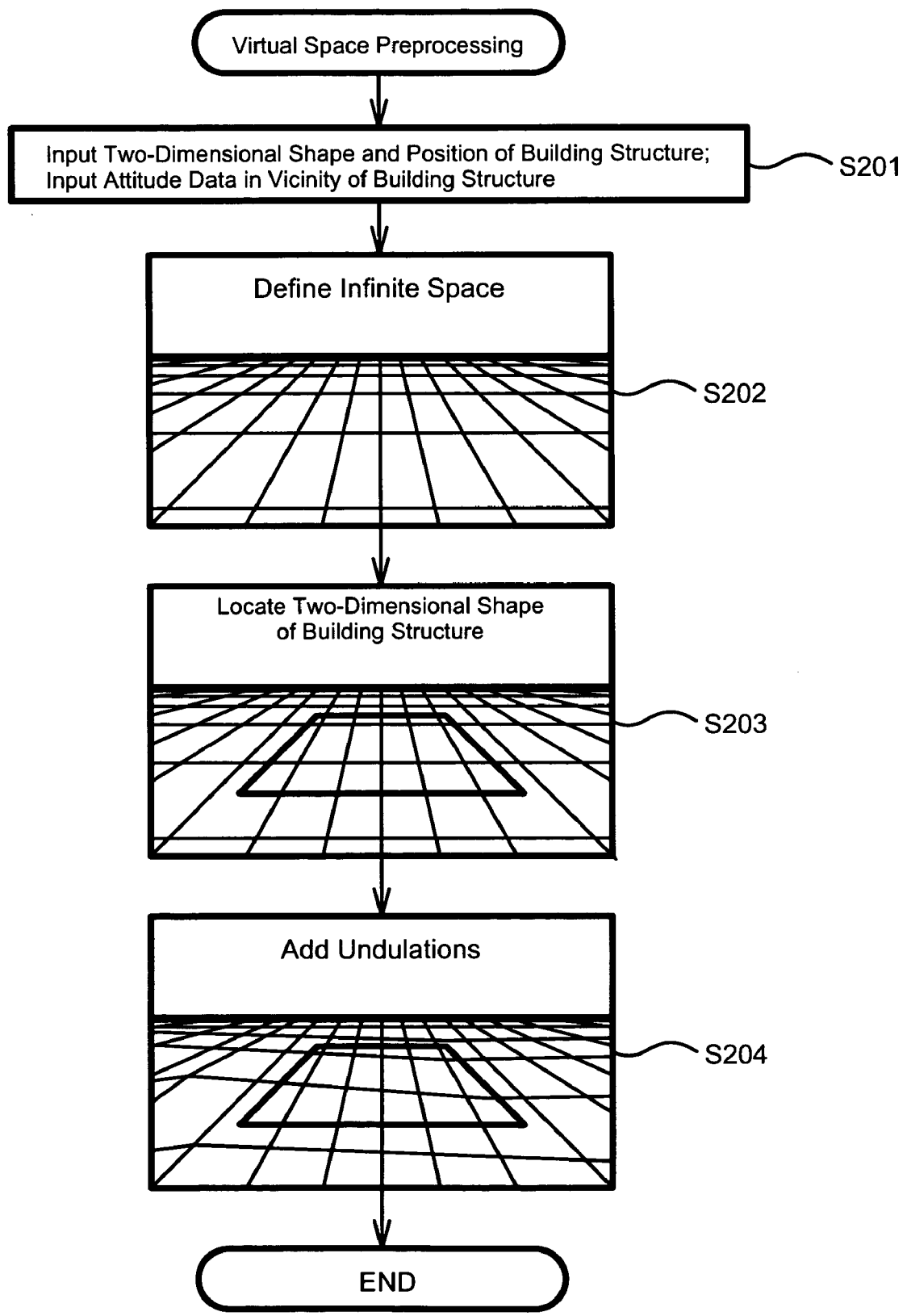
FIG. 11 is a flowchart showing the details of virtual space preprocessing.

FIG. 11 is a flowchart showing the details of the virtual space preprocessing. This process corresponds to the functions of the preprocessing module 110 (see FIG. 5). When this process starts in response to the operator's input of a command, the system 100 inputs the two-dimensional shape and the position of a building structure as a modeling object and altitude data in the vicinity of the building structure (step S201). The procedure of this embodiment uses two-dimensional map data to specify the two-dimensional shape and the position of the building structure. An aerial photograph or a record at the shooting site may be used instead, for such specification. The procedure of this embodiment inputs the planar shape of the building structure as a complete closed figure, based on the two-dimensional map data. One possible modification may input only part of the building structure observable in a photograph. When a rear face of the building structure is unobservable in the photograph, for example, the unobservable part may be omitted from the input and the planar shape may be input with polygonal lines. In this case, a three-dimensional model of the building structure is completed by individually generating a model of a front face and a model of a rear face and integrating these models with each other. The position of the building structure may be specified in an absolute coordinate system, for example, by the latitude and the longitude, or may be specified according to the positional relation to the shooting position. The procedure of this embodiment uses altitude data provided by Geographical Survey Institute for the altitude data in the vicinity of the building structure, although this is not restrictive at all.

The system 100 then defines a virtual space as infinite space (step S202). A preferable procedure gives a display of the defined infinite space seen from a certain point of view, as illustrated. A known technique is applicable to three-dimensional graphical display of the virtual space. The position of the viewpoint for the three-dimensional graphical display is set arbitrarily, but setting the position of the viewpoint equal to the shooting position is desirable for the smooth progress of the subsequent processing.

After definition of the infinite space, the system 100 locates the two-dimensional shape of the building structure, based on the data input step S201 (step S203). A thick frame in the illustration represents the two-dimensional shape of the building structure.

The system 100 finally adds undulations to the display of the infinite space, based on the input altitude data (step S204). The system 100 also modifies the two-dimensional shape of the building structure to be fit to the ground surface with the undulations added. This completes the series of preprocessing.

Figure 12:
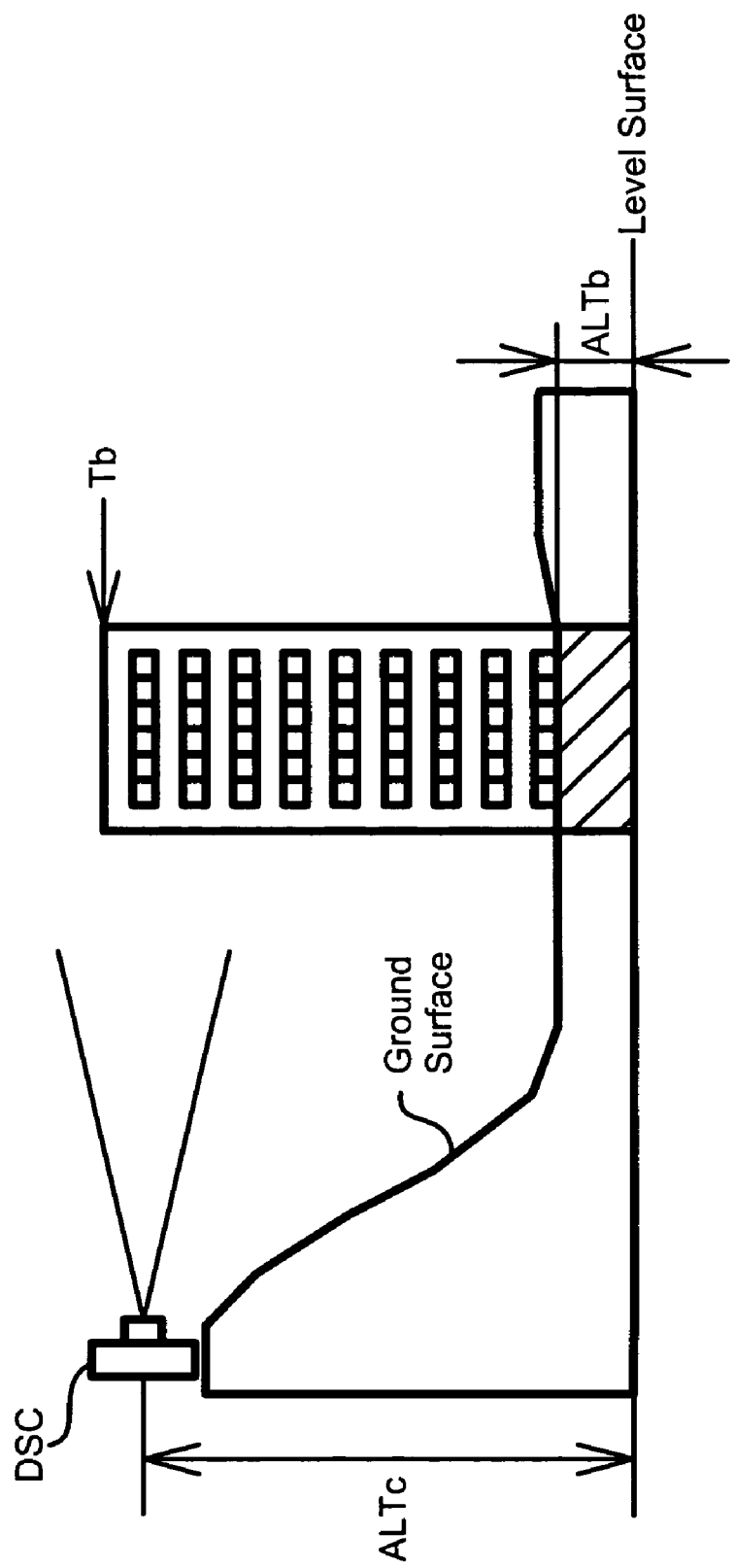
FIG. 12 shows the significance of addition of undulations.

FIG. 12 shows the significance of addition of the undulations. The illustration gives a side view of the building structure and the camera. As illustrated, the ground surface has a certain altitude in the vicinity of the building structure and another altitude in the vicinity of the shooting position. Namely the ground surface does not coincide with the level surface. The altitude of the camera DSC at the time of shooting and the altitude of the building structure are respectively expressed as ALTc and ALTb.

Figure 1:
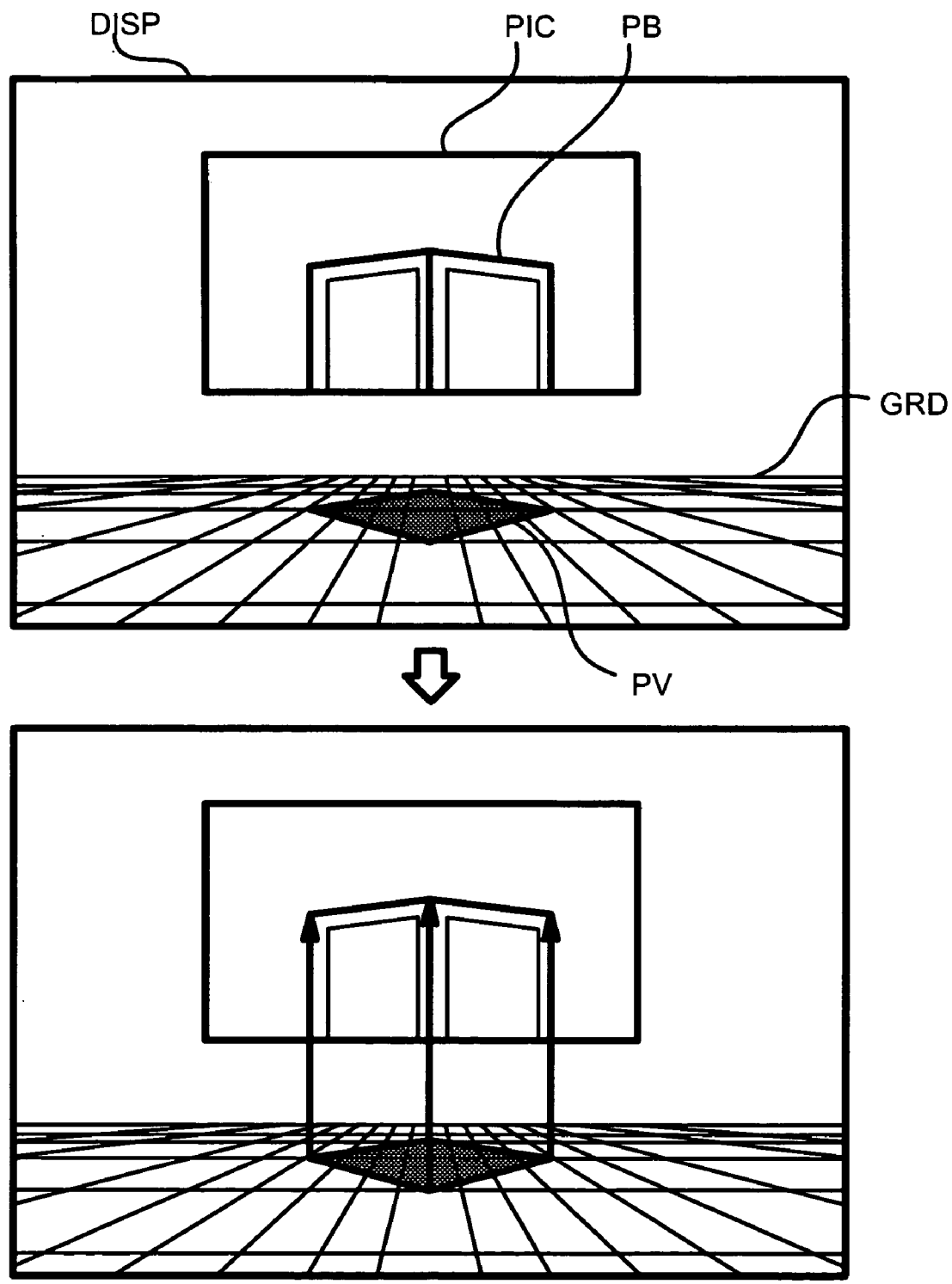
FIG. 1 shows the principle of three-dimensional modeling in the present invention.
Figure 2:
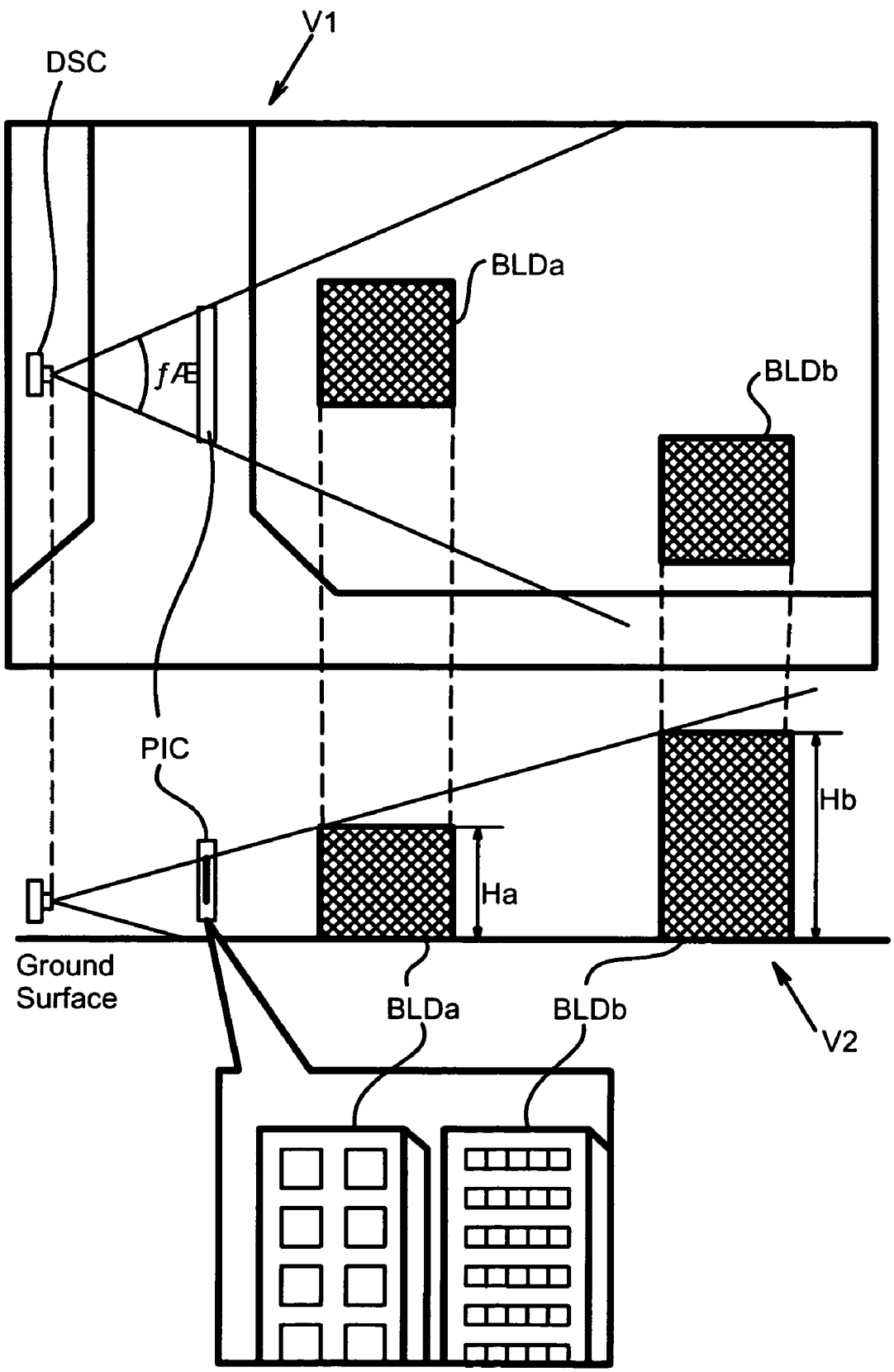
FIG. 2 shows the relation between a photographed image and a building structure.

As clearly understood from the principle shown in FIGS. 1 and 2, the modeling method of this embodiment does not specify the height of the building structure from the ground surface but specifies the position of a top Tb of the building structure. This position Tb is determined relative to the shooting position of the camera DSC. Even in the case where the undulations of the ground surface in the virtual space are not taken into consideration, setting the camera DSC at the altitude ALTc accurately specifies the position of the top Tb or the altitude of the building structure. In this case, however, the building structure including a space between the actual ground surface and the level surface (that is, a hatched area in the illustration) is subjected to modeling. The resulting model of the building structure has a height different from the actual height and thus does not accurately reflect the actual state. In order to prevent this potential problem, the procedure of the embodiment adds the undulations to the ground surface and then locates the two-dimensional shape of the building structure on the ground surface with the undulations.

The procedure of this embodiment carries out modeling of the building structure, after addition of the undulation to the ground surface. One modified procedure may carry out modeling of the building structure and omit the hatched area from a resulting model by taking into account the altitude. The addition of undulation may be omitted when there is little difference between the altitude in the vicinity of the shooting position and the altitude in the vicinity of the building structure.

C2. Auto Modeling Process

Figure 13:
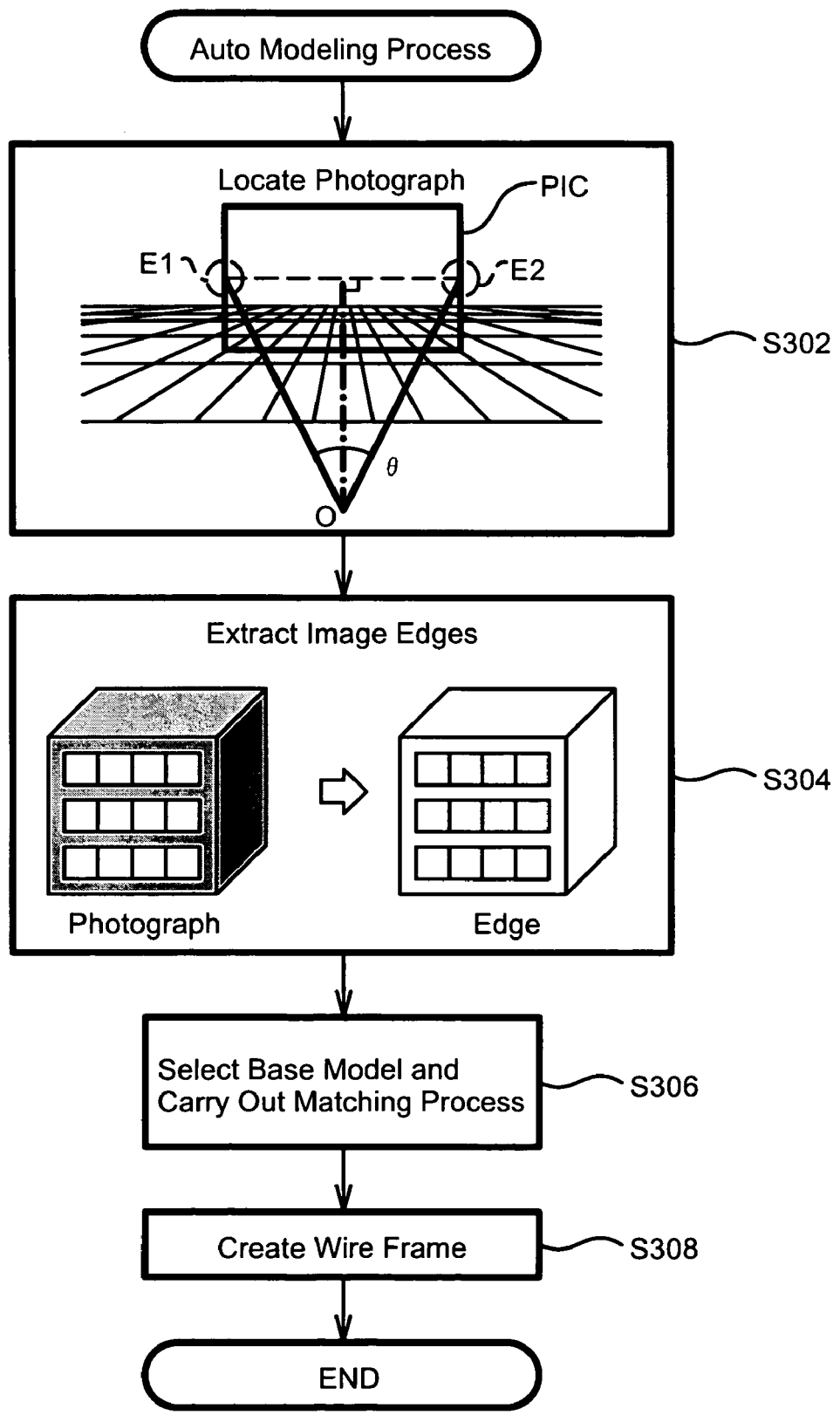
FIG. 13 is a flowchart showing the details of auto modeling process.

FIG. 13 is a flowchart showing the details of the auto modeling process. This process corresponds to the functions of the auto modeling module 120 (see FIGS. 5 and 6).

When the auto modeling process starts, the system 100 locates a photograph PIC of the building structure in the virtual space. The arrangement of the photograph is also shown in the illustration. The origin O represents the shooting position set in the virtual space. The shooting parameters specify the angle of view θ and the shooting direction at the time of photographing. The shooting direction defined by the yaw angle and the pitch angle at the time of shooting is shown by the one-dot chain line. The photograph is located in the virtual space under restriction of conditions that the photograph is to be located vertical to the one-dot chain line and that both ends of the photograph correspond to a range defined by the angle of view θ (see E1 and E2 in the illustration). For an inclination-free, upright display of the building structure in the virtual space, the photograph is rotated about the one-dot chain line, based on the roll angle at the time of shooting.

After the arrangement of the photograph, the system 100 extracts the edges of the image (step S304). The extraction of the image edges is also shown in the illustration. As shown in the left-side drawing, the photograph of the building structure has different tones on respective faces across the edges as the boundaries by the effects of the light ray. The system 100 extracts the edges of the building structure, based on the tone differences. This method is, however, not restrictive, and any of other diverse methods is applicable to the extraction of the edges.

On completed extraction of the edges, the system 100 successively selects base models and carries out the matching process to judge the overlap status (step S306). The base models have the various shapes as discussed above with reference to FIG. 6. The procedure of this embodiment selects one option of the base model and carries out the matching process. In the case of an unsatisfactory result of the matching, the procedure determines that selection of the current option of the base model is inadequate and selects a next option of the base model in a preset order.

Figure 14:
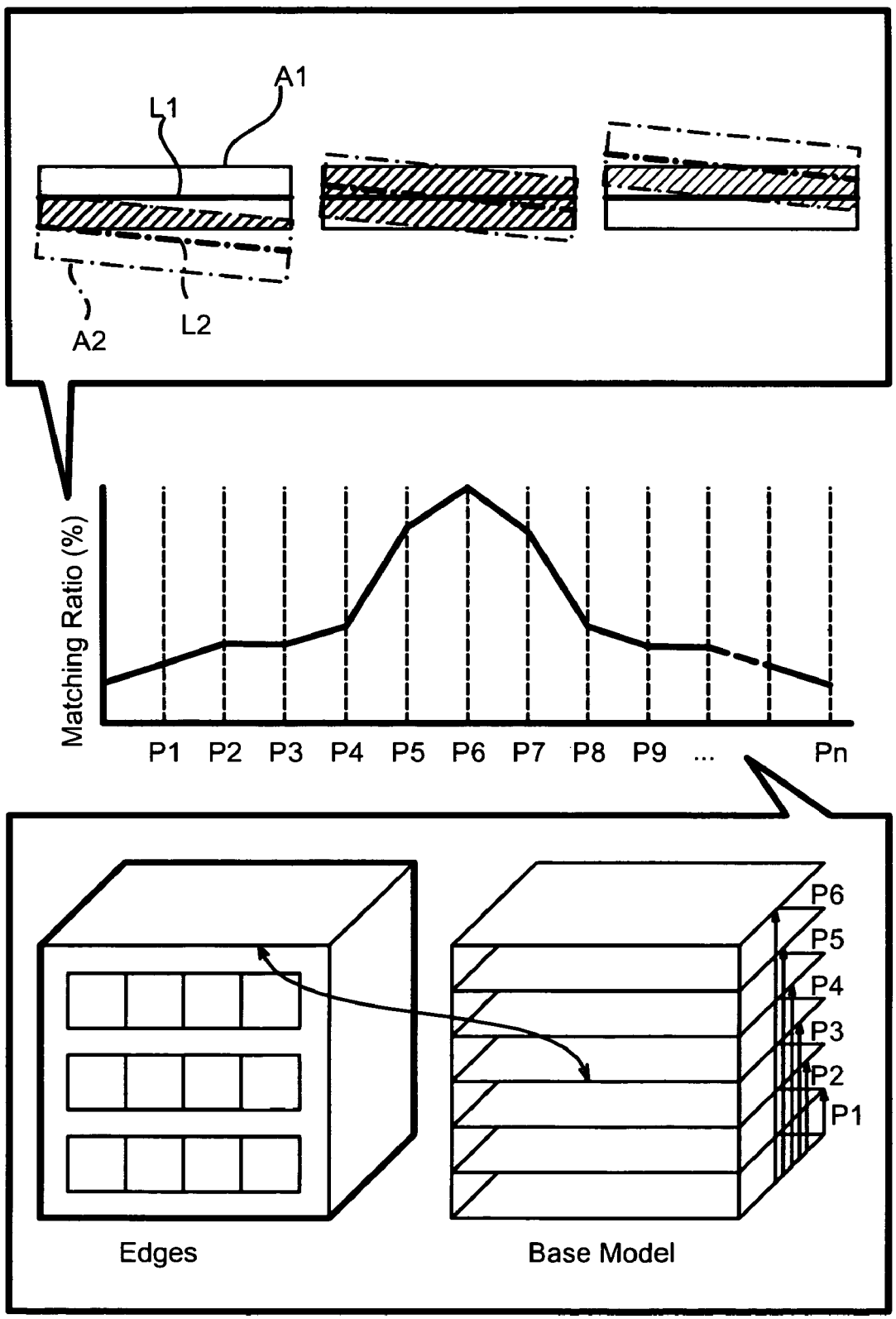
FIG. 14 shows a method of judging an overlap status.

FIG. 14 shows a method of judging the overlap status. The bottom drawings show the procedure of matching. The left-side drawing shows an edge-extracted model from the building structure as the modeling object. The system 100 changes the height of a base model in multiple stages as Pa, P2, . . . , and judges the overlap status of an extracted edge with a line segment included in the selected base model. For example, the system 100 judges the overlap status of the parts pointed by the arrow with regard to a height P3.

A method shown by the upper drawings is, for example, applied to the judgment of the overlap status. The procedure defines a region A1 of a fixed width around an edge L1 shown by the solid line. In a similar manner, the procedure defines a region A2 of a fixed width around a side L2 of the base model shown by the dotted line. The positional relation between the edge L1 and the side L2 specifies an overlap (a hatched area in the illustration) of the regions A1 and A2. The area of the overlap varies with a variation in height of the base model. For example, an increase in height of the base model first increases and then decreases the area of the overlap, as shown by the left-to-right change of the drawings. This variation is shown in a center graph. The matching ratio represents the area of the overlap to the total area of the regions A1 and A2. As shown in this graph, the matching ratio gradually increases with an increase in height of the base model, reaches the maximum at a height P6, and then decreases. The system 100 determines the state of matching of the extracted edge with the base model at the height P6, based on the variation in matching ratio. The procedure may further divide the part around the height P6 into smaller sections and make each smaller section subjected to the matching process. This method is not restrictive at all, and any of other diverse methods is applicable to the judgment of the overlap status.

On completion of the matching, the system 100 specifies the height of the eventually selected base model, based on the result of the matching, and creates a wire frame of the building structure as the modeling object (step S308).

C3. Manual Modeling Process

Figure 15:
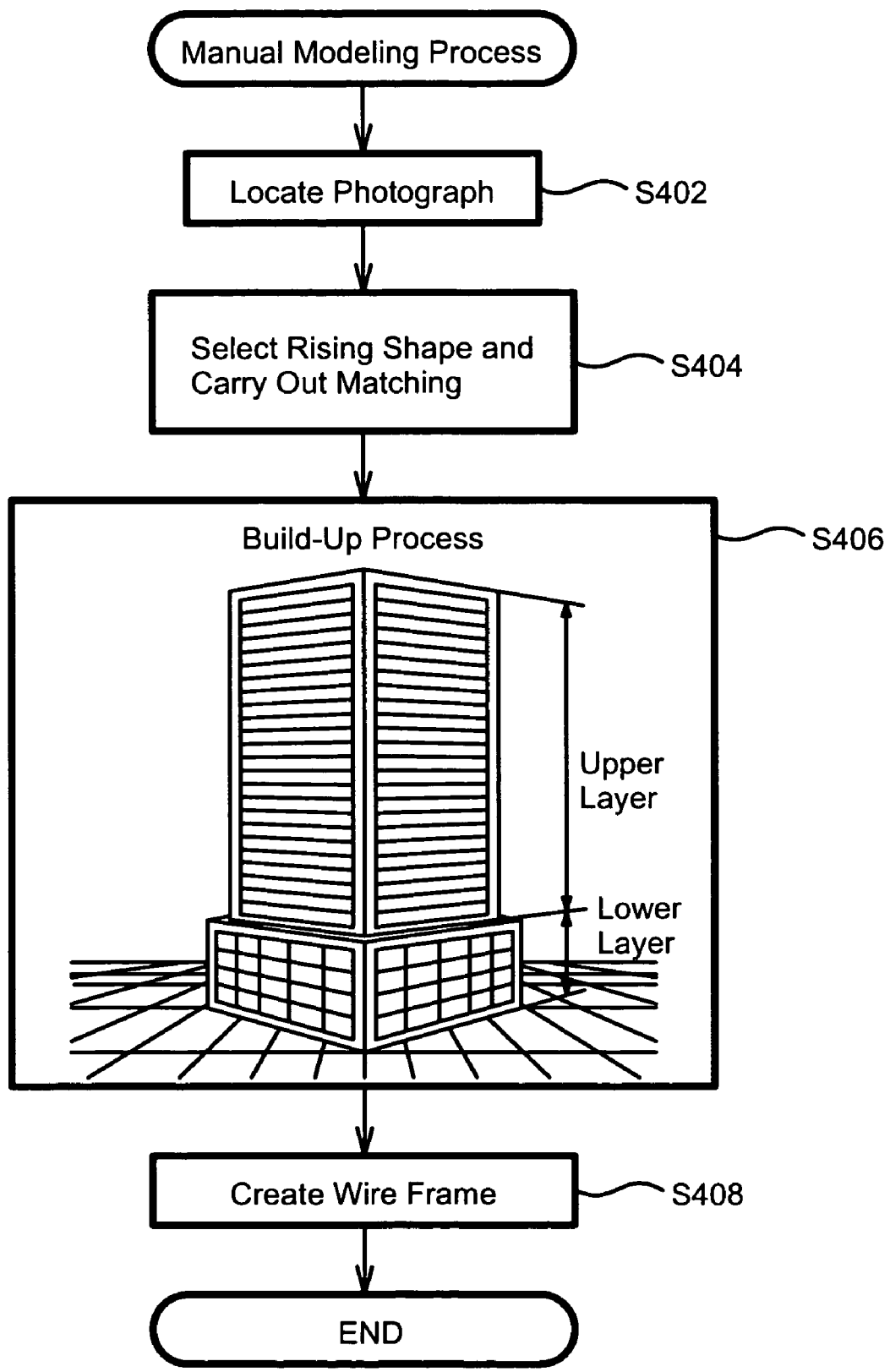
FIG. 15 is a flowchart showing the details of manual modeling process.

FIG. 15 is a flowchart showing the details of the manual modeling process. This process corresponds to the functions of the manual modeling model 130 (see FIGS. 5 and 7).

When the manual modeling process starts in response to the operator's input of a command, the system 100 locates a photograph in the virtual space (step S402). The arrangement of the photograph follows the procedure at step S302 in the auto modeling process (FIG. 13). The photograph located in the virtual space is shown on the display of the system 100.

The operator selects a rising shape and carries out a matching process, based on the planar shape and the photograph arranged in the virtual space (step S404). The operator checks the shape of the building structure and selects a rising shape, which is expected to be suitable for the shape of the building structure, among the options as shown in FIG. 7. In response to the operator's instruction of a height in the virtual space, the system 100 generates and displays a model of the selected rising shape and the instructed height in the virtual space. The operator then performs the matching process, which adjusts the height to make the display of the model matched with the photograph. A variety of methods may be applicable to the instruction of the height. From the viewpoint of easiness in operation, one desirable method uses a pointing device like a mouse to give an instruction on the display of the virtual space.

The manual modeling technique is adopted to generate a model of complicated shape, which has difficulties in auto modeling. The simple matching process may not ensure a satisfactory result of modeling for a building structure of complicated shape. The manual modeling technique proceeds to a build-up process for modeling the building structure of such complicated shape (step S406). The outline of the build-up process is also given in the illustration. The build-up process is adopted to generate a model of a building structure having different planar shapes in an upper layer and in a lower layer, like an illustrated example. Integration of a lower-layer model with an upper-layer model completes a final model of the building structure. The build-up process accordingly involves integration of multiple models. Integration of multiple models is not restricted to a stack in the vertical direction but may be an alignment in the horizontal direction.

Figure 16:
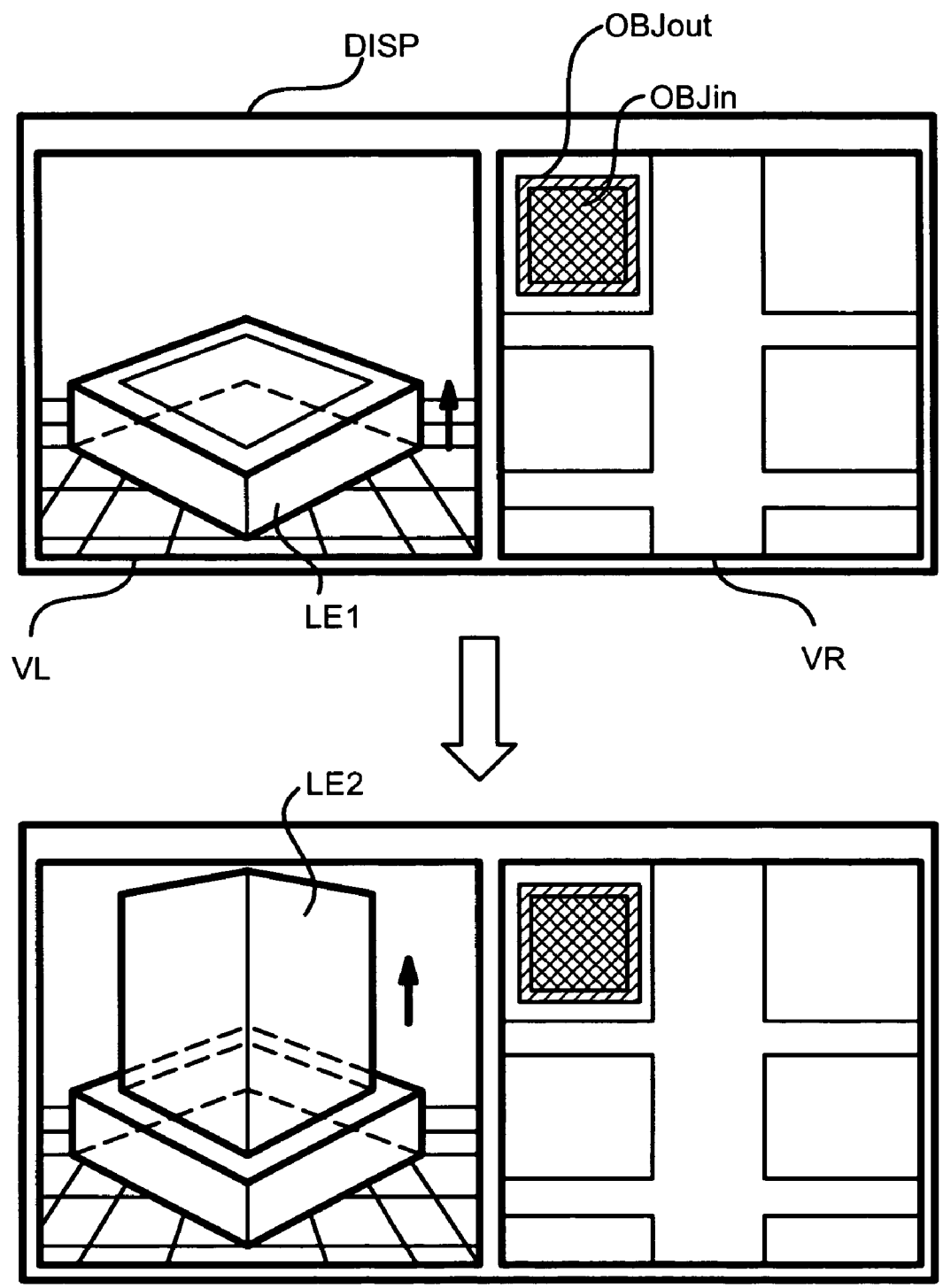
FIG. 16 shows a build-up method.

FIG. 16 shows a method of the build-up process. The illustration gives a screen window open on a display DISP of the system 100. The screen window includes a three-dimensional display VL of the virtual space on the left and a two-dimensional display VR on the right side. The photograph of the building structure is omitted from the illustration.

The two-layered building structure shown in FIG. 15 has an upper-layer planar shape OBJin and a lower-layer planar shape OBJout. The operator shifts the lower-layer planar shape OBJout in the direction of height to create a lower-layer model LE1, which is given on the left side of the illustration. In the procedure of this embodiment, the upper-layer planar shape OBJin does not affect the lower-layer model LE1 in this stage. Namely the planar shape OBJin is simply located above the lower-layer model LE1, and the shape of the model LE1 does not depend upon the setting of the planar shape OBJin.

The operator subsequently shifts the upper-layer planar shape OBJin in the direction of height to create an upper-layer model LE2. In the procedure of the embodiment, the upper-layer model LE2 is formed above the top face of the lower-layer model LE1. This step-by-step approach implements modeling of a multi-layered building structure. This method of the build-up process is only illustrative and not restrictive at all. One possible modification may, for example, create the lower-layer model LE1 having a hollow space on the center thereof, in which the upper-layer model LE2 is to be located, create the upper-layer model LE1 on the ground surface, and integrate the upper-layer model LE2 with the lower-layer model LE1. Another possible modification may create the lower-layer model LE2 having the identical shape with that of the embodiment, create the upper-layer model LE1 on the ground surface, and integrate the lower-layer model LE1 with the upper-layer model LE2 by Boolean operation.

The illustrated example of FIG. 16 has the known lower-layer and upper-layer planar shapes. When the upper-layer planar shape OBJin is unknown, the operator may be allowed to define the planar shape in either the three-dimensional display VL or the two-dimensional display VR. The definition may be implemented before modeling of the lower layer or after modeling of the lower layer and before modeling of the upper layer.

On completion of the matching and the build-up process, the system 100 specifies the height of the completed base model, based on the result of the matching and the build-up, and creates a wire frame of the building structure as the modeling object (step S408).

C4. Texture Creation Process

Figure 17:
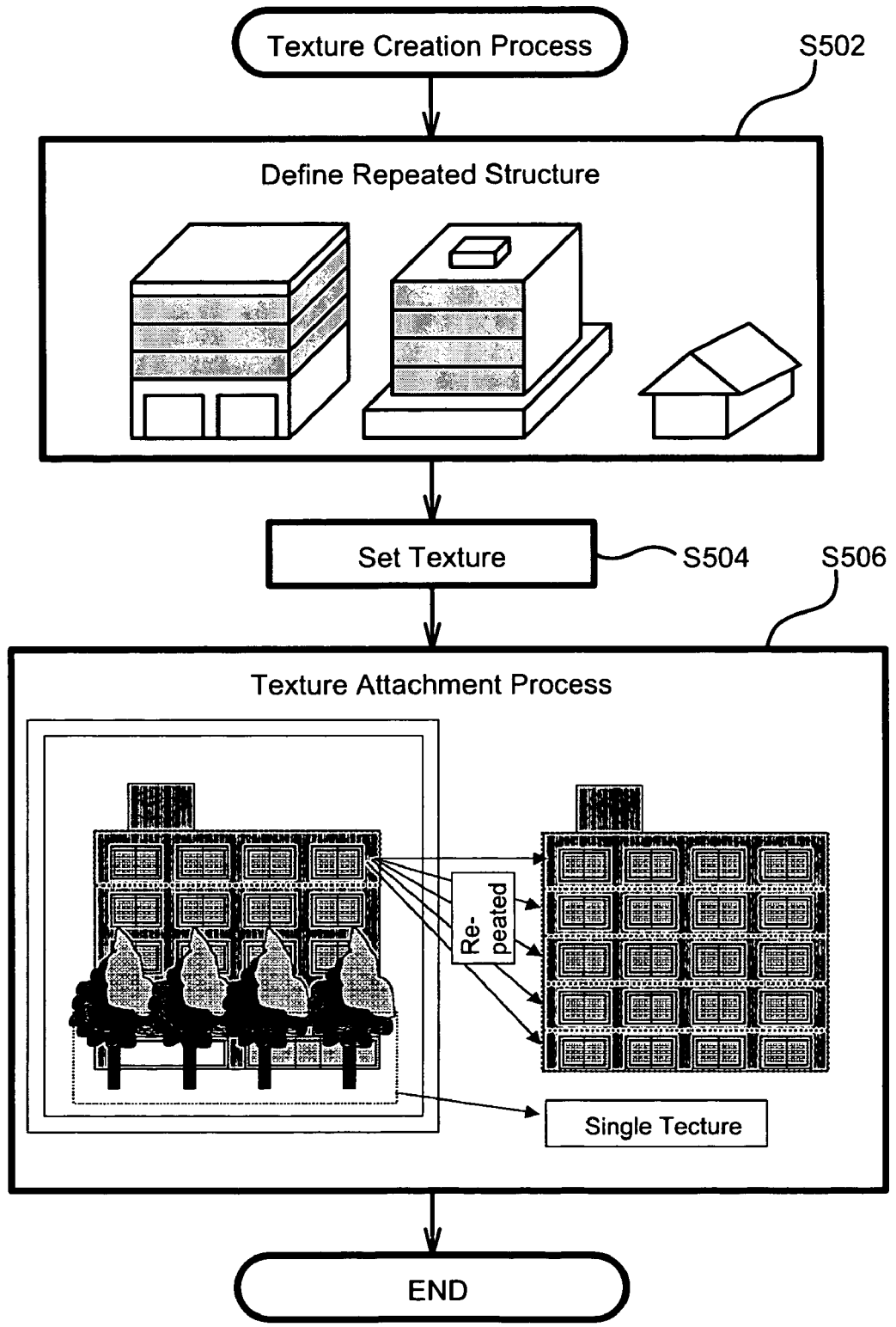
FIG. 17 is a flowchart showing the details of texture creation process.

FIG. 17 is a flowchart showing the details of the texture creation process. This process corresponds to the functions of the texture creation module 140 (see FIGS. 5 and 8).

When the texture creation process starts, the operator first defines a repeated structure (step S502) to set a repetition area, to which an identical texture is repeatedly applied, and a residual single area. An example of the repeated structure is given in the illustration. The hatched portion corresponds to the repetition area. When respective stories have a similar structure as in the case of an office building, the repetition area may be set in the unit of story. The portion other than the repetition area is defined as the single area.

The repetition area is defined as the unit of attachment of the texture and may thus not correspond to the actual status of the building structure. For example, a building structure shown in the center drawing has a repeated structure of multiple stories on a front face but an integral side face. With regard to this building structure, the procedure may set a repetition area in the unit of story on the front face, while setting a single area on the side face.

On completion of definition of the repeated structure, the operator sets a texture (step S504). Here the texture is created, based on the photograph of the building structure. This photograph may be the same as that used for three-dimensional modeling. The procedure of this embodiment, however, uses a photograph showing the front side of the building structure to relive the load of adapting the texture to the model. At the texture setting step, the operator cuts off part of the photograph as the texture and performs required modification including changes in shape and tone of the cut-off texture to fit the surface of the model. The modification includes integration of and separation into multiple textures.

On completion of setting the texture, the system 100 executes attachment of the texture in response to the operator's command (step S506). The illustration also shows attachment of the texture to the repetition area. The left-side drawing shows a photograph of a building structure, and the right-side drawing shows a resulting created model. As illustrated, the model is completed by repeatedly attaching the photograph of the top story to the respective stories. In many cases, trees and other obstacles are present on the front side of a building structure, so that it is difficult to gain the texture of the whole building structure. The procedure of the embodiment defines the repetition area and utilizes the texture of a best-shot part, such as the top story of the building structure. This ensures relatively easy attachment of the texture to the whole building structure. In the illustrated example, the texture for the repetition area is also used as a single texture to be attached to a single area on the first story. A different texture may alternatively be used for the single texture.

C5. Additional Structure Setting Process

The additional structure setting process corresponds to the functions of the additional structure setting module 150 (see FIG. 5). This process defines additional structures in the vicinity of a building structure, separately from modeling of the building structure itself. The procedure of this embodiment arranges a preset model of additional structures in response to the operator's operations. The additional structures are classified by the specification method of arrangement into point structures and line structures.

Figure 18:
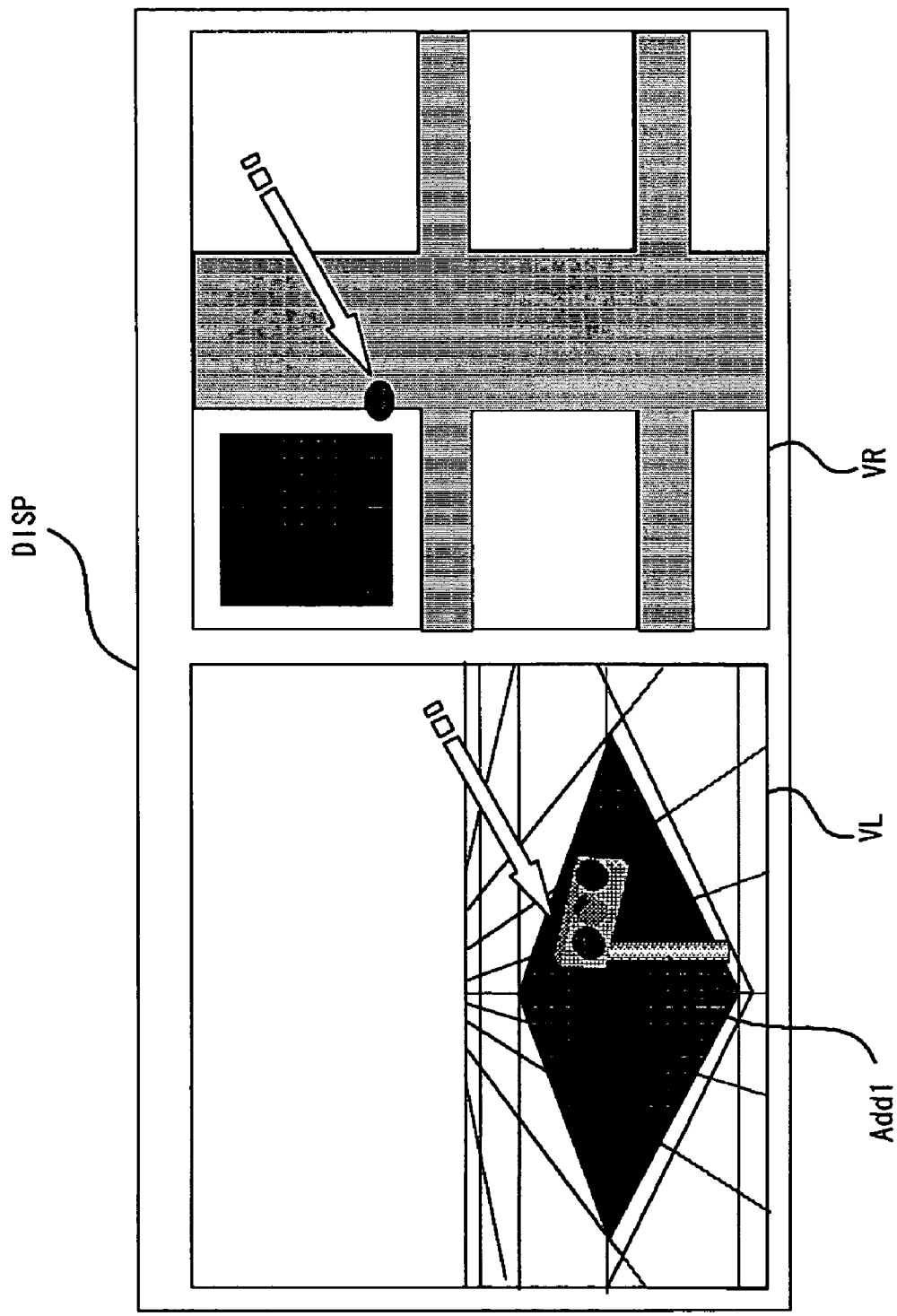
FIG. 18 shows an example of setting a point structure.

FIG. 18 shows an example of setting a point structure. The point structure represents an additional structure, of which model is located by specifying one point, at which the additional structure is to be arranged. Small-sized examples of the point structure include traffic signals, street lamps, telephone poles, postboxes, bus stops, phone booths, roadside trees, and traffic signs. Large-sized examples of the point structure include steel towers of high-tension cables, relay stations of cellular phones, gas stations, and various chain stores, such has CVS, having standardized shapes. Such point structures may be created by the conventional three-dimensional modeling technique, instead of the modeling technique of this embodiment.

The illustration shows a display when a traffic signal is arranged as an example of the point structure. As mentioned previously, the three-dimensional display VL in the virtual space is shown on the left side of the display DISP, and the two-dimensional display VR on the right side. The operator selects the type of the point structure and specifies a setting point of the selected point structure in the two-dimensional display VR as shown by the arrow. This gives a model Add1 of traffic signal in the three-dimensional display VL. In the case of a street tree or any equivalent structure, the height may also be set in the three-dimensional display VL.

Figure 19:
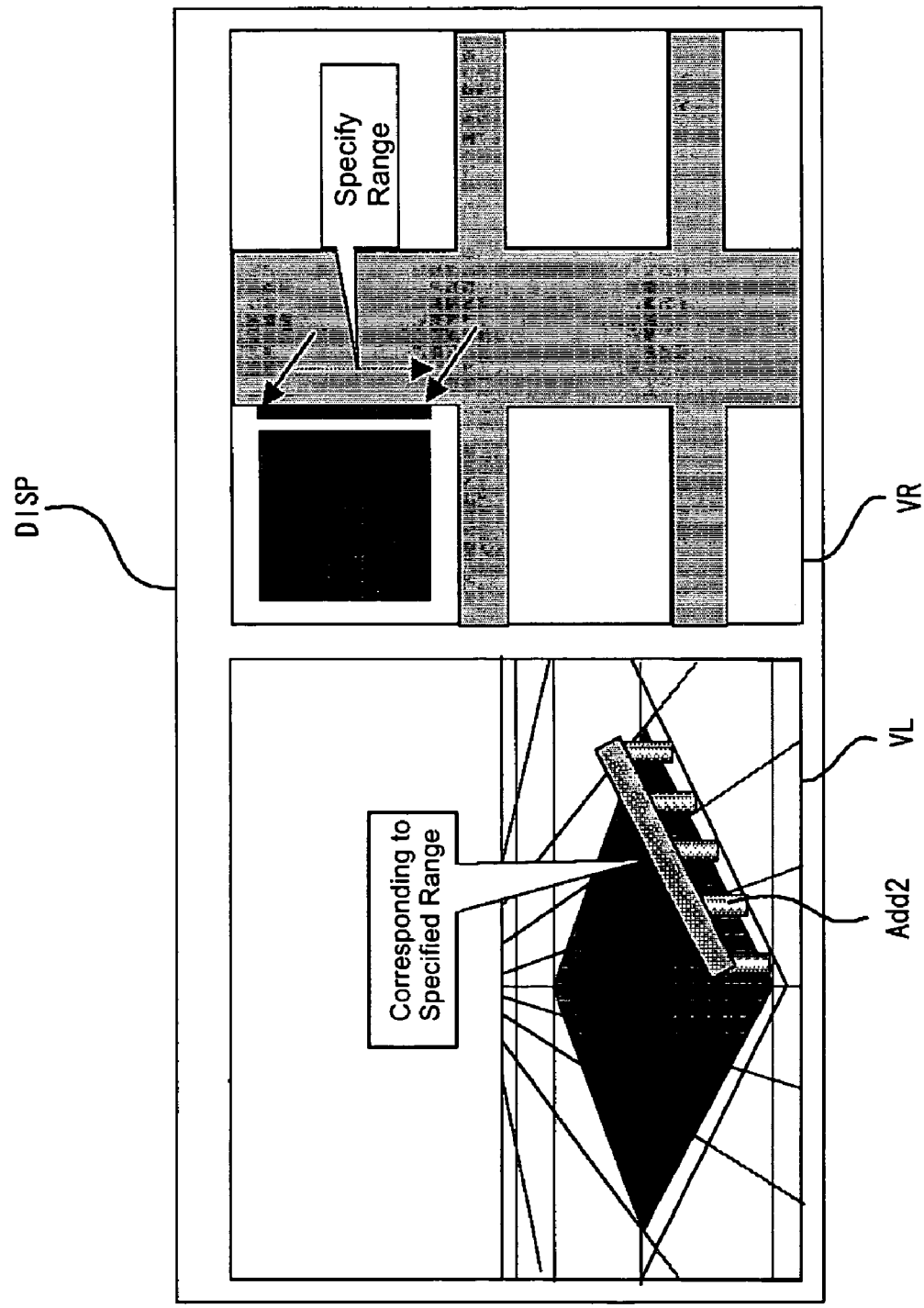
FIG. 19 shows an example of setting a line structure.

FIG. 19 shows an example of setting a line structure. The line structure represents an additional structure, of which model is located by specifying a linear range, on which the additional structure is to be arranged. Examples of the line structure include guardrails, walls, fences, white lines drawn on roads, such as zebra crossings, bridges and equivalents of various shapes, and central reserves. Such line structures may also be created by the conventional three-dimensional modeling technique. A base model having a unit length is registered in advance for each line structure. The base model is repeatedly applied over a specified range.

The illustration shows a display when a guardrail is arranged as an example of the line structure. Specification of a linear range, that is, specification of a start point and an end point of a line segment, in the two-dimensional display VR as shown by the arrows gives a model Add2 of guardrail in the three-dimensional display VL.

D. Effects

The electronic map data generation system of the embodiment discussed above completes three-dimensional modeling without actually measuring the height of the building structure. Namely the technique of the invention ensures accurate modeling of the building structure with relatively light load.

The series of processing shown in FIG. 10 and subsequent drawings describes the procedure of modeling a single building structure. When one photograph includes multiple building structures, the technique of the invention is applicable to parallel modeling of the multiple building structures. This ensures efficient generation of the three-dimensional electronic map data.

The procedure of the embodiment uses the texture based on the photograph of the building structure and thereby enhances the touch of reality in modeling. Application of the repeated structure effectively relives the operator's load in attachment of the texture.

E. Modification

The embodiment regards the procedure of modeling with the photograph taken on the ground. The photograph used for this purpose is not restricted to those taken on the ground, as long as the shooting parameters and the shooting position are known. For example, an aerial photograph of cross shot of the building structure may be used instead. The aerial photograph having the known shooting parameters and shooting position is preferably used for efficient three-dimensional modeling in a wider range.

The procedure of this embodiment follows the steps shown in FIG. 10 to effectuate modeling. Either auto modeling or manual modeling may be omitted, if not necessary. The texture creation process and the additional structure setting process are carried out to add the touch of reality, and may be omitted according to the applications of modeling.

The embodiment discussed above is to be considered in all aspects as illustrative and not restrictive. There may be many modifications, changes, and alterations without departing from the scope or spirit of the main characteristics of the present invention. For example, the series of control processing may be actualized by the hardware construction, instead of the software configuration.

INDUSTRIAL APPLICABILITY

The present invention is directed to the three-dimensional modeling method of generating three-dimensional electronic data of a building structure. The technique of the invention is applicable to the field of generating three-dimensional electronic map data by taking advantage of the three-dimensional modeling method.

The invention claimed is:

1. A three-dimensional modeling method of generating three-dimensional electronic data of a building structure, said three-dimensional modeling method comprising the steps of:
   (a) inputting a photograph and a horizontal planar shape of the building structure expressed by electronic data;
   (b) inputting a positional relation between a shooting position of the photograph and the building structure and a shooting parameter that specifies a viewing direction and an angle of view at a time of photographing;
   (c) defining the planar shape of the building structure and the shooting position in a virtual space set for generation of the three-dimensional electronic data, based on the input positional relation, and arranging the photograph at a position defined by the input shooting parameter in the virtual space; and
   (d) specifying a height of the building structure by raising the defined planar shape of the building structure in the virtual space to reach an extension of a virtual line that connects the shooting position defined in the virtual space with a top of the building structure in the photograph arranged in the virtual space, so as to specify a shape of the building structure in the direction of height.

2. A three-dimensional modeling method in accordance with claim 1, wherein the planar shape is specified by a two-dimensional plane map including the building structure.

3. A three-dimensional modeling method in accordance with claim 1, wherein said step (c) defines a three-dimensional base model giving a rough contour of the building structure, as well as the planar shape.

4. A three-dimensional modeling method in accordance with claim 1, wherein said step (d) comprises the sub-steps of:
   analyzing the photograph to specify an edge of the building structure;
   quantitatively analyzing an overlap status of a side of the planar shape with the specified edge in the course of the raising; and
   selecting a raising position at which the overlap status becomes a local maximum, so as to specify the height of the building structure.

5. A three-dimensional modeling method in accordance with claim 1, said three-dimensional modeling method further comprising the step of:
   inputting altitude data representing an altitude of ground surface in the vicinity of the building structure, prior to said step (c),
   wherein said step (c) comprises the sub-step of making the input altitude data reflect on the ground surface in the vicinity of the building structure, and
   said step (d) specifies the shape of the building structure in the direction of height, above the ground surface.

6. A three-dimensional modeling method in accordance with claim 1, said three-dimensional modeling method further comprising the step of:
   (e) attaching at least part of the photograph as a texture to surface of a resulting model of the building structure having the shape in the direction of height specified in said step (d).

7. A three-dimensional modeling method in accordance with claim 6, wherein said step (e) comprises the sub-steps of:
   defining a repetition area, to which a similar unit structure is repeatedly applied, and a residual single area other than the repetition area on the surface of the building structure; and
   repeatedly attaching a texture of the unit structure to the repetition area, whether an actual structure is included or not included in the photograph.

8. A three-dimensional modeling method in accordance with claim 1, wherein the electronic data expressing the photograph of the building structure do not include height data of the building structure.

9. A three-dimensional modeling method in accordance with claim 1, wherein the height of the building structure is not separately determined or obtained prior to raising the defined planar shape of the building structure in the virtual space.

10. A three-dimensional modeling device that generates three-dimensional electronic data of a building structure, said three-dimensional modeling device comprising:
    a first input module that inputs a photograph and a horizontal planar shape of the building structure expressed by electronic data;
    a second input module that inputs a positional relation between a shooting position of the photograph and the building structure and a shooting parameter that specifies a viewing direction and an angle of view at a time of photographing; and
    a modeling module that defines the planar shape and the shooting position in a virtual space set for generation of the three-dimensional electronic data, based on the input positional relation, arranges the photograph at a position defined by the input shooting parameter in the virtual space, and specifies a height of the building structure by raising the defined planar shape in the virtual space to reach an extension of a virtual line that connects the shooting position defined in the virtual space with a top of the building structure in the photograph arranged in the virtual space, so as to specify a shape of the building structure in the direction of height.

11. A three-dimensional modeling device in accordance with claim 10, wherein said modeling module comprises:

an edge analysis sub-module that analyzes the photograph to specify an edge of the building structure; and an overlap status analysis sub-module that quantitatively analyzes an overlap status of a side of the planar shape with the specified edge in the course of the raising, and selects a raising position at which the overlap status becomes a local maximum, so as to specify the height of the building structure.

12. A data collection device that collects data used by a three-dimensional modeling device in accordance with either one of claims 10 and 11 to generate three-dimensional electronic data of a building structure, said data collection device comprising:

a shooting module that obtains the photograph of the building structure in the form of electronic data;

a shooting parameter acquisition module that acquires the shooting parameter; and a data storage module that stores the obtained electronic data and the acquired shooting parameter mapped to data regarding the shooting position.

13. A data collection device in accordance with claim 12, wherein said shooting module is a digital camera, and said shooting parameter acquisition module is incorporated in said digital camera and acquires an orientation and a focal length of said camera at a time of photographing.

14. A three-dimensional modeling device in accordance with claim 10, wherein the modeling module does not separately determine or obtain the height of the building structure prior to raising the define planar shape in the virtual space.

15. A recording medium in which a computer program is recorded in a computer readable manner, said computer program causing a computer to assist generation of three-dimensional electronic data of a building structure, said computer program causing the computer to attain the functions of:

inputting a photograph and a horizontal planar shape of the building structure expressed by electronic data;

inputting a positional relation between a shooting position of the photograph and the building structure and a shooting parameter that specifies a viewing direction and an angle of view at a time of photographing;

defining the planar shape and the shooting position in a virtual space set for generation of the three-dimensional electronic data, based on the input positional relation, and arranging the photograph at a position defined by the input shooting parameter in the virtual space; and specifying a height of the building structure by raising the defined planar shape of the building structure in the virtual space to reach an extension of a virtual line that connects the shooting position defined in the virtual space with a top of the building structure in the photograph arranged in the virtual space, so as to specify a shape of the building structure in the direction of height.

16. A computer program in accordance with claim 15, wherein the height of the building structure is not separately determined or obtained prior to raising the defined planar shape of the building structure in the virtual space.

17. A method of constructing a three-dimensional model of a building structure in a virtual space, wherein the three-dimensional model of the building structure has a width, a depth, and a height in the virtual space, the method comprising:

defining a viewing position in the virtual space from where the three-dimensional model of the building structure is to be viewed during its construction;

arranging a photograph of the building structure in the virtual space in relationship to the viewing position, such that viewing the building structure in the photograph from the viewing position in the virtual space is spacially equivalent to viewing the building structure through a camera used to shoot the photograph from a shooting position in a real space at a time when the photograph is taken;

arranging a two-dimensional model that represents a base of the building structure in directions of the width and the depth in the virtual space in relationship to the viewing position, such that the two-dimensional model coincides with a corresponding base of the building structure in the photograph when viewed from the viewing position; and without separately determining or obtaining the height of the three-dimensional model of the building structure in the virtual space, extending the two-dimensional model in a direction of height to obtain the three-dimensional model of the building structure in the virtual space, such that a top of the three-dimension model of the building structure coincides with a corresponding top of the building structure in the photograph when viewed from the viewing position.

18. The method in accordance with claim 17, wherein the photograph of the building structure is arranged in the virtual space in relationship to the viewing position based on a viewing direction and a viewing angle of viewing the building structure through the camera used to shoot the photograph from the shooting position in the real space at the time when the photograph is taken.

* * * * *